(12) United States Patent
Anderson et al.

(10) Patent No.: US 9,431,305 B1
(45) Date of Patent: Aug. 30, 2016

(54) VERTICAL TRANSISTOR FABRICATION AND DEVICES

(71) Applicant: INTERNATIONAL BUSINESS MACHINES CORPORATION, Armonk, NY (US)

(72) Inventors: Brent A. Anderson, Jericho, VT (US); Bruce B. Doris, Slingerlands, NY (US); Seong-Dong Kim, LaGrangeville, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/975,168

(22) Filed: Dec. 18, 2015

(51) Int. Cl.
| | |
|---|---|
| *H01L 27/092* | (2006.01) |
| *H01L 21/8238* | (2006.01) |
| *H01L 29/786* | (2006.01) |
| *H01L 29/78* | (2006.01) |
| *H01L 29/423* | (2006.01) |
| *H01L 27/112* | (2006.01) |
| *H01L 29/66* | (2006.01) |

(52) U.S. Cl.
CPC .......... *H01L 21/823885* (2013.01); *H01L 21/823807* (2013.01); *H01L 21/823814* (2013.01); *H01L 27/092* (2013.01); *H01L 27/11273* (2013.01); *H01L 29/42392* (2013.01); *H01L 29/66666* (2013.01); *H01L 29/7848* (2013.01); *H01L 29/78618* (2013.01); *H01L 29/78642* (2013.01); *H01L 29/78684* (2013.01); *H01L 29/78696* (2013.01); *H01L 29/7802* (2013.01); *H01L 29/7827* (2013.01)

(58) Field of Classification Search
CPC ............. H01L 21/823807; H01L 21/823814; H01L 27/092; H01L 27/42392; H01L 29/78618; H01L 29/78642; H01L 29/78684; H01L 29/78696; H01L 21/823885; H01L 27/11273; H01L 29/66666; H01L 29/7802; H01L 29/7827

See application file for complete search history.

(56) References Cited

U.S. PATENT DOCUMENTS

| | | | |
|---|---|---|---|
| 5,550,396 A | * | 8/1996 | Tsutsumi ............ H01L 27/0922 257/330 |
| 6,294,418 B1 | | 9/2001 | Noble |

(Continued)

OTHER PUBLICATIONS

Larrieu, et al., "Vertical Nanowire Array-based Field Effect Transistors for Ultimate Scaling", Nanoscale, This journal is The Royal Society of Chemistry, Jan. 2013, pp. 2437-2441.

(Continued)

*Primary Examiner* — Ermias Woldegeorgis
(74) *Attorney, Agent, or Firm* — Tutunjian & Bitetto, P.C.; Vazken Alexanian

(57) ABSTRACT

A method of fabricating a vertical field effect transistor including forming a first recess in a substrate; epitaxially growing a first drain from the first bottom surface of the first recess; epitaxially growing a second drain from the second bottom surface of a second recess formed in the substrate; growing a channel material epitaxially on the first drain and the second drain; forming troughs in the channel material to form one or more fin channels on the first drain and one or more fin channels on the second drain, wherein the troughs over the first drain extend to the surface of the first drain, and the troughs over the second drain extend to the surface of the second drain; forming a gate structure on each of the one or more fin channels; and growing sources on each of the fin channels associated with the first and second drains.

13 Claims, 18 Drawing Sheets

(56) References Cited

U.S. PATENT DOCUMENTS

| | | |
|---|---|---|
| 6,580,124 B1 | 6/2003 | Cleeves et al. |
| 7,683,428 B2 | 3/2010 | Chidambarrao et al. |
| 7,993,999 B2 | 8/2011 | Basker et al. |
| 8,274,110 B2 | 9/2012 | Sandhu et al. |
| 8,637,849 B2 | 1/2014 | Deligianni et al. |
| 9,087,897 B1 | 7/2015 | Anderson et al. |
| 2012/0319201 A1* | 12/2012 | Sun ................ H01L 21/823487 257/338 |

OTHER PUBLICATIONS

Shen, et al., "Vertical GAA Silicon Nanowire Transistor with Impact of Temperature on Device Parameters", World Academy of Science, Engineering and Technology, International Scholarly and Scientific Research & Innovation, Nov. 2010, pp. 944-947, vol. 4.

* cited by examiner

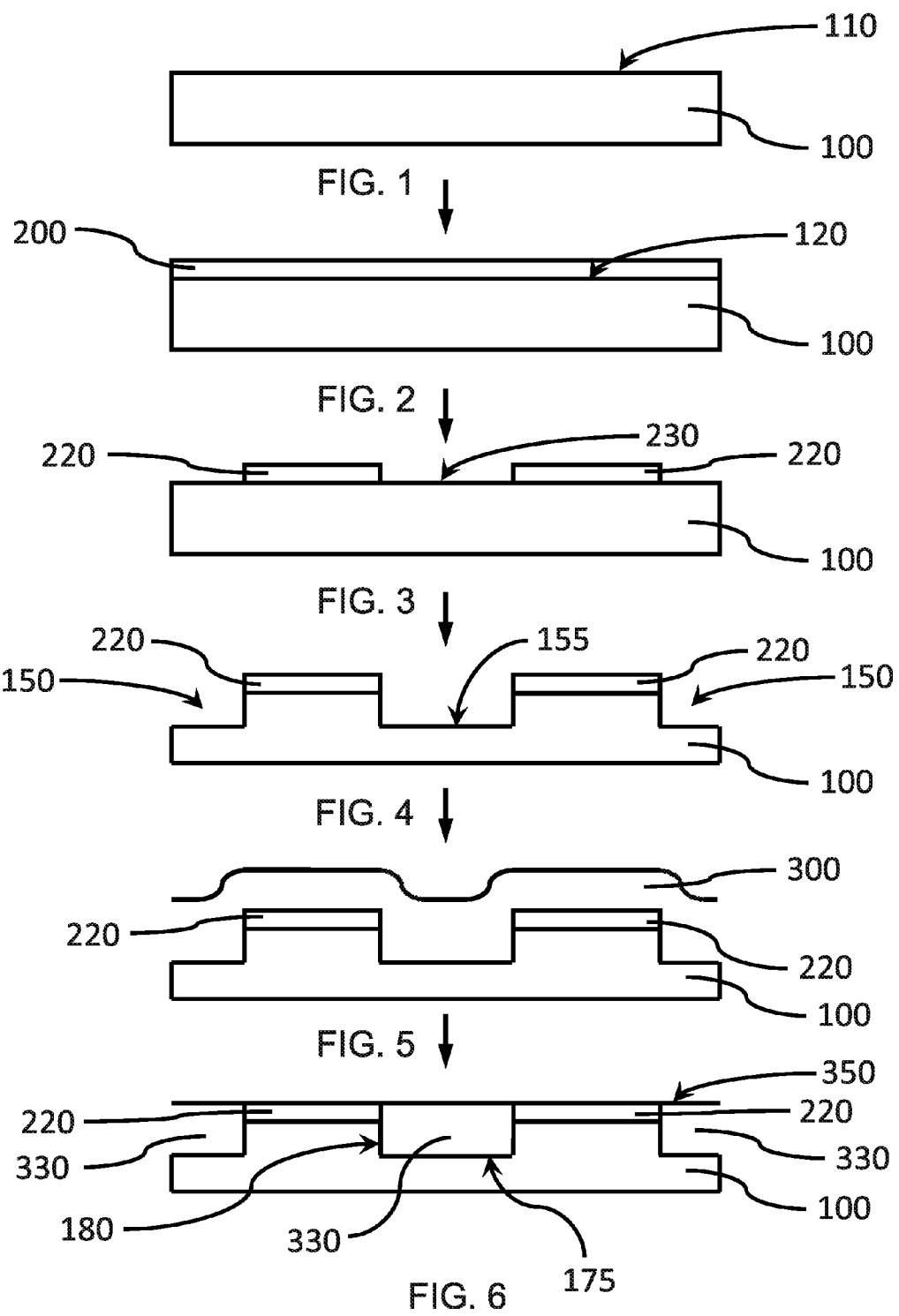

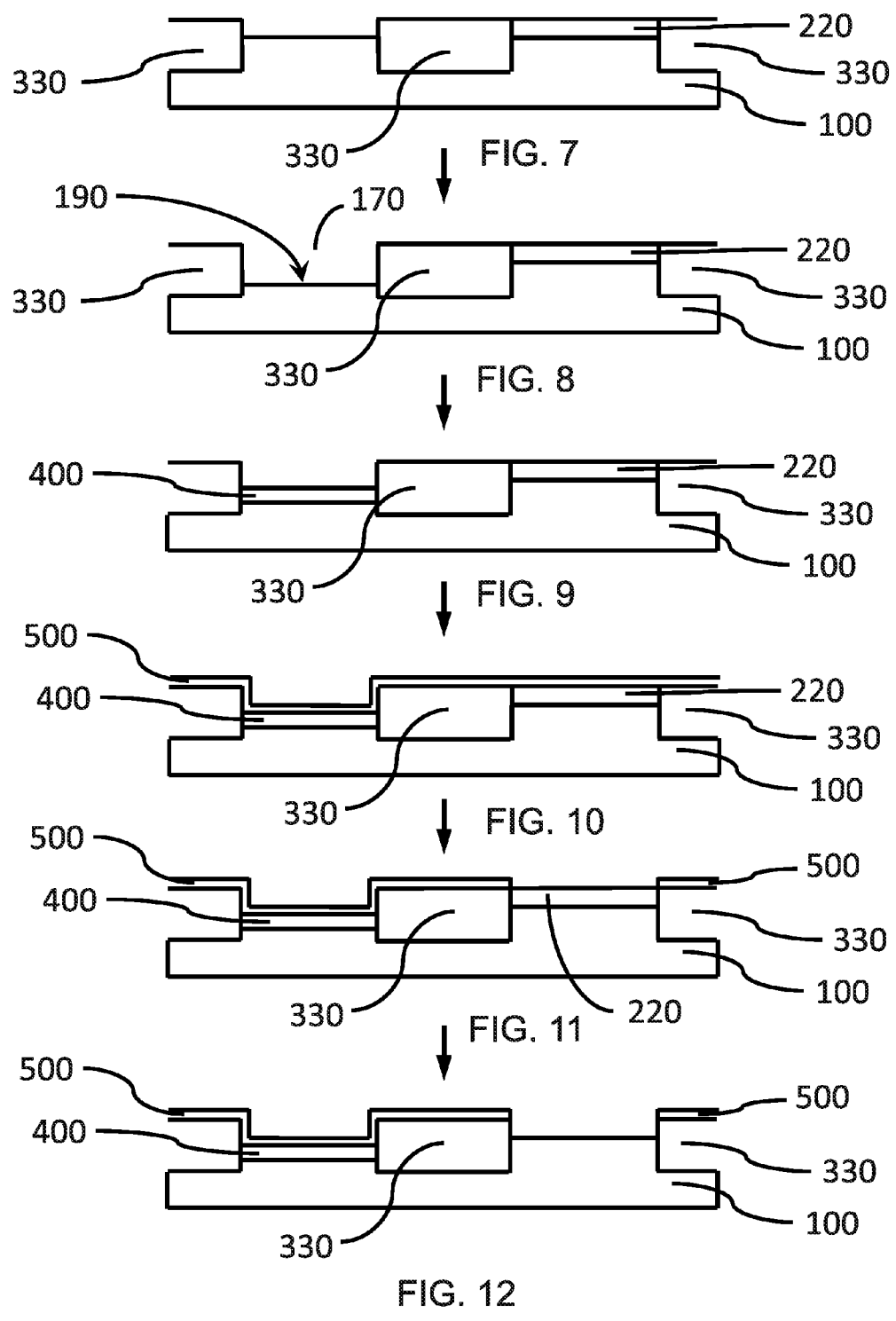

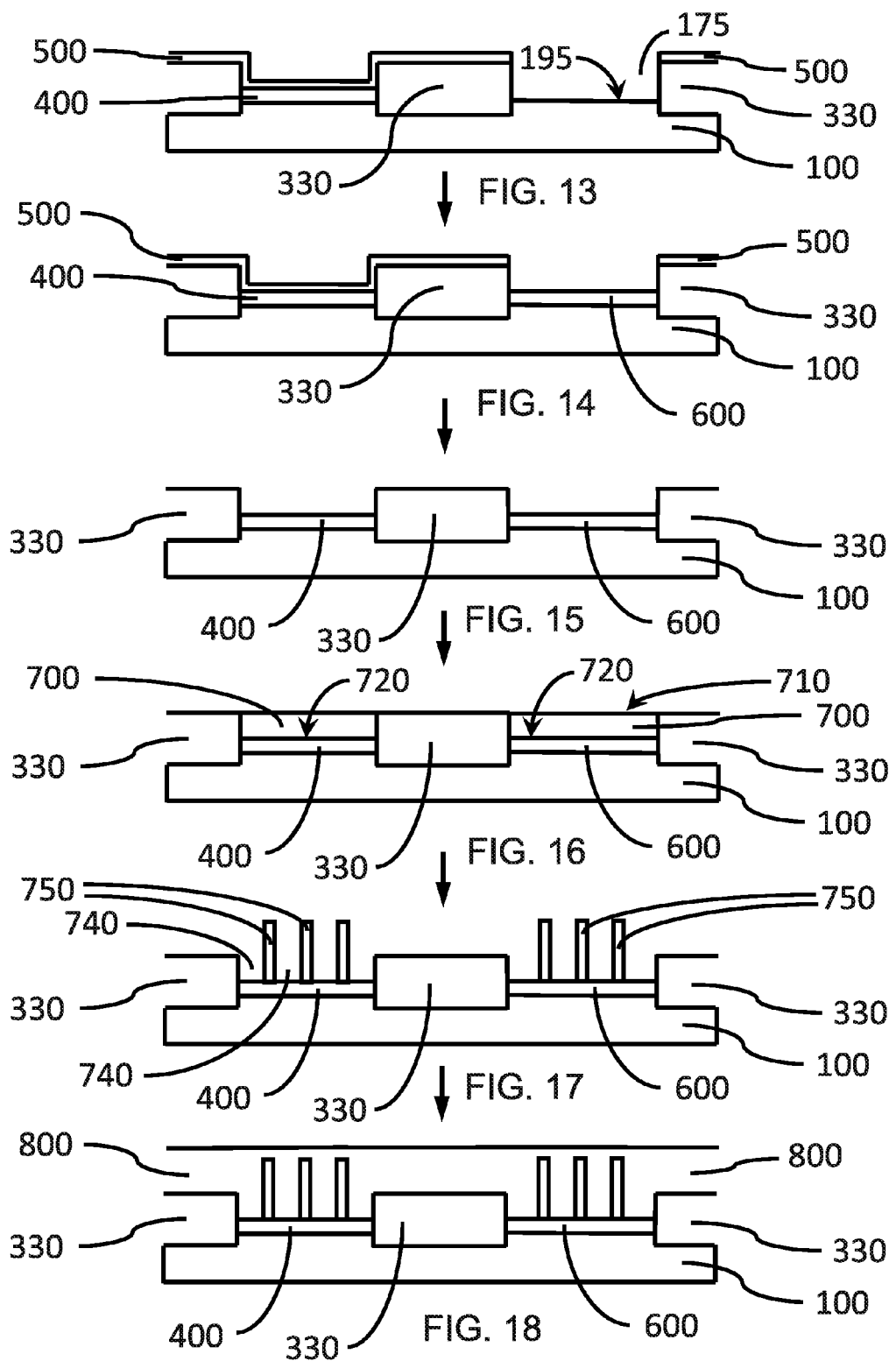

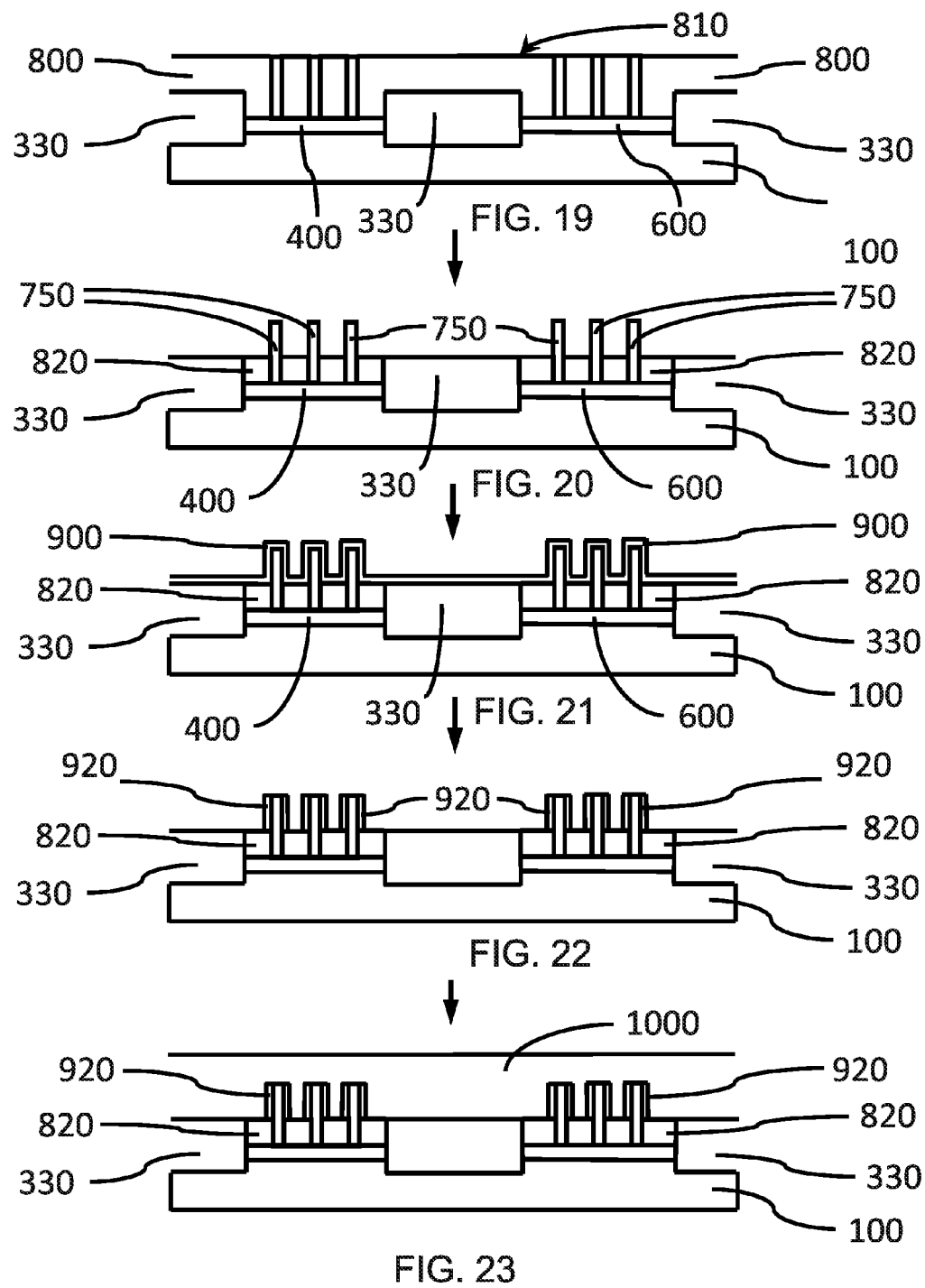

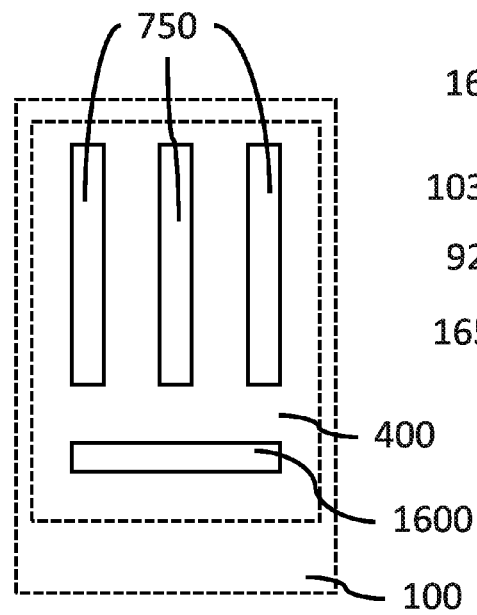
FIG. 43
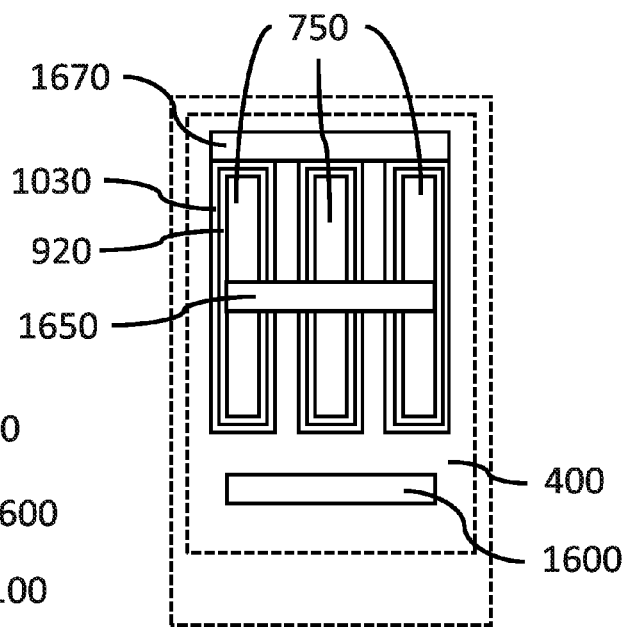
FIG. 44
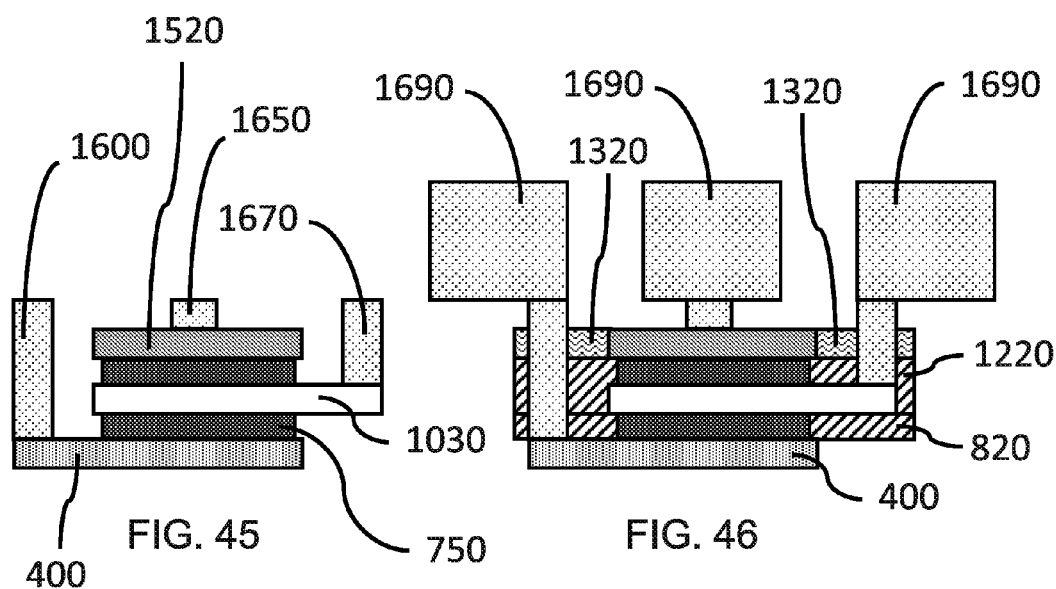
FIG. 45
FIG. 46

200

VERTICAL TRANSISTOR FABRICATION AND DEVICES

BACKGROUND

1. Technical Field

The present invention relates to methods of forming vertical finFET devices and the electronic device structures produced thereby, and more particularly to a method of epitaxially forming the drain, channel, and source of a vertical finFET such that the drain, channel, and source have the same crystal orientation.

2. Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been formed with the source, channel, and drain formed in the substrate material itself, where the current flows horizontally (i.e., in the plane of the substrate), and FinFETs have been formed with the channel extending outward from the substrate, but where the current also flows horizontally. The channel for the FinFET can be an upright slab of thin rectangular Si, commonly referred to as the fin with a gate on the fin, as compared to a MOSFET with a single planar gate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are connected in series.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method of fabricating a vertical field effect transistor includes forming a first recess in a substrate, wherein the first recess has a first bottom surface; epitaxially growing a first drain from the first bottom surface of the first recess; epitaxially growing a second drain from the second bottom surface of a second recess formed in the substrate; epitaxially growing a channel material on the first drain and the second drain; forming troughs in the channel material to form one or more fin channels on the first drain and one or more fin channels on the second drain, wherein the troughs over the first drain extend to the surface of the first drain, and the troughs over the second drain extend to the surface of the second drain; forming a gate structure on each of the one or more fin channels; and growing sources on each of the fin channels associated with the first and second drains.

A vertical field effect transistor includes a first recess in a substrate, wherein the first recess has a first bottom surface. A first drain is grown from the first bottom surface of the first recess, wherein the first drain has the same crystal orientation as the first bottom surface. A second recess is formed in the substrate, wherein the second recess has a second bottom surface, and a second drain is grown on the second bottom surface of a second recess formed in the substrate, wherein the second drain has the same crystal orientation as the second bottom surface. One or more fin channels are formed on the first drain, wherein the one or more fin channels on the first drain have the same crystal orientation as the first bottom surface, and one or more fin channels are formed on the second drain, wherein the one or more fin channels on the second drain have the same crystal orientation as the second bottom surface. A gate structure is formed on each of the fin channels, and sources are grown on each of the fin channels associated with the first drain and the second drain, wherein the sources have the same crystal orientation as the fin channels.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view of a substrate for an electronic device structure according to an exemplary embodiment;

FIG. 2 is a cross-sectional view of a substrate and a surface layer for an electronic device structure according to an exemplary embodiment;

FIG. 3 is a cross-sectional view of a substrate and a patterned surface layer for an electronic device structure according to an exemplary embodiment;

FIG. 4 is a cross-sectional view of a substrate with etched recesses and a patterned surface layer for an electronic device structure according to an exemplary embodiment;

FIG. 5 is a cross-sectional view of a substrate with recessed regions with a dielectric fill for an electronic device structure according to an exemplary embodiment;

FIG. 6 is a cross-sectional view of a substrate with shallow trench isolation regions of an electronic device structure according to an exemplary embodiment;

FIG. 7 is a cross-sectional view of a substrate with exposed substrate regions of an electronic device structure according to an exemplary embodiment;

FIG. 8 is a cross-sectional view of a substrate with exposed substrate regions of an electronic device structure according to an exemplary embodiment;

FIG. 9 is a cross-sectional view of a substrate with a first drain region of an electronic device structure according to an exemplary embodiment;

FIG. 10 is a cross-sectional view of a substrate with a hardmask for an electronic device structure according to an exemplary embodiment;

FIG. 11 is a cross-sectional view of a substrate with a partially removed hardmask for an electronic device structure according to an exemplary embodiment;

FIG. 12 is a cross-sectional view of a substrate with exposed substrate regions of an electronic device structure according to an exemplary embodiment;

FIG. 13 is a cross-sectional view of a substrate with exposed substrate regions of an electronic device structure according to an exemplary embodiment;

FIG. 14 is a cross-sectional view of a substrate with a second drain region of an electronic device structure according to an exemplary embodiment;

FIG. 15 is a cross-sectional view of a substrate with a hardmask removed from the electronic device structure according to an exemplary embodiment;

FIG. 16 is a cross-sectional view of a substrate with a channel material forming the electronic device structure according to an exemplary embodiment;

FIG. 17 is a cross-sectional view of a substrate with fin channels of an electronic device structure according to an exemplary embodiment;

FIG. 18 is a cross-sectional view of a substrate with a low-k dielectric material forming the electronic device structure according to an exemplary embodiment;

FIG. 19 is a cross-sectional view of a substrate with a low-k dielectric material forming the electronic device structure according to an exemplary embodiment;

FIG. 20 is a cross-sectional view of a substrate with a low-k dielectric material forming the electronic device structure according to an exemplary embodiment;

FIG. 21 is a cross-sectional view of a substrate with a WFM layer of an electronic device structure according to an exemplary embodiment;

FIG. 22 is a cross-sectional view of a substrate with WFM caps of an electronic device structure according to an exemplary embodiment;

FIG. 23 is a cross-sectional view of a substrate with gate material forming an electronic device structure according to an exemplary embodiment;

FIG. 43 is a cross-sectional top view of a substrate with a drain and a plurality of fin channels of an electronic device structure according to an exemplary embodiment;

FIG. 44 is a cross-sectional top view of a substrate with drain contacts, gate contacts, and source contacts of an electronic device structure according to an exemplary embodiment;

FIG. 45 is a cross-sectional side view of a fin channel assembly with drain contacts, gate contacts, and source contacts of an electronic device structure according to an exemplary embodiment;

FIG. 46 is a cross-sectional side view of a fin channel assembly showing multiple layers of an electronic device structure according to an exemplary embodiment;

DETAILED DESCRIPTION

Figure 24:
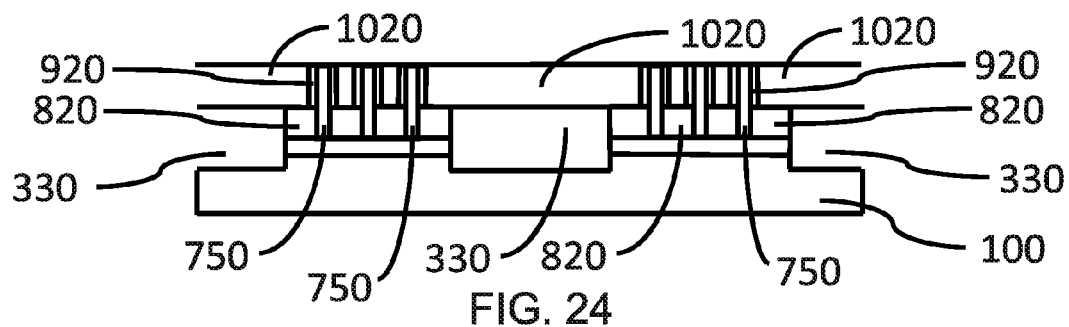
FIG. 24 is a cross-sectional view of a substrate with a reduced height gate material forming an electronic device structure according to an exemplary embodiment.

Principle and embodiments of the present disclosure relate to a semiconductor device structure with conductive elements stacked on the substrate to form a conductive path normal to the surface of the substrate on which the semiconductor structure is formed. An embodiment relates generally to a vertical finFET structure that provides enhanced geometries for electrical contact formation and current carrying properties. In an embodiment, a finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

In one or more embodiments, a source, drain, and channel of a finFET are grown epitaxially on a crystalline substrate. In various embodiments, a source or drain is formed epitaxially directly on the substrate and the a fin channel is epitaxially formed directly on the source or drain, where the substrate, drain, fin channel, and source all have the same crystal structure and orientation.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiN, GaAs or SiGe. These compounds include different proportions of the elements within the compound, e.g., GaAs includes $Ga_x As_{1-x}$, where x is less than or equal to 1, or SiGe includes $Si_x Ge_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of" for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

In one or more embodiments, a front end process for building vertical finFETs includes several process modules to prepare building blocks of the finFET, where separate device components are formed by each process module.

In various embodiments, the device components have a smallest or narrowest dimension of <10 nm, although other node sizes are also contemplated.

Referring now to the drawings in which like numerals represent the same or similar elements and initially to FIG. 1, which is a diagram of a substrate for an electronic device structure according to an exemplary embodiment. The diagram shows a cross-sectional view illustrating the x and z directions of the device structure.

In various embodiments, a substrate 100 may be a semiconductor. The substrate may be crystalline. The substrate may be primarily (i.e., with doping) of a single element, for example, silicon (Si) or germanium, (Ge), or the substrate may be a compound, for example, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 100 may be a silicon wafer. In an embodiment, the substrate is a single crystal silicon wafer.

An exposed surface 110 of substrate 100 may be a material different from the bulk or body of the substrate 100, or may be a component-rich surface of a compound material, for example, a silicon-rich or germanium-rich layer of a SiGe substrate, a gallium-rich layer of a GaAs substrate, or a nitrogen-rich surface of a GaN layer, where the exposed surface may be one of two altering atomic layers. In various embodiments, the substrate may have a graded concentration, where for example, the exposed material at the surface of the substrate is primarily silicon with a predetermined crystal orientation suitable for epitaxial growth, whereas the bulk material may comprise other chemical elements, for example, germanium. In various embodiments, the thickness of the single crystal material at the surface 110 may be greater than about 200 nm thick, or greater than about 300 nm thick, or greater than about 500 nm thick. For example, an SOI substrate may have a single crystal silicon surface layer about 300 nm thick above the insulating layer.

In various embodiments, a doped material has impurity concentration in the range of parts-per-billion to parts-per-thousand, or more specifically from about $10^{13}$ cm$^{-3}$ to about $10^{18}$ cm$^{-3}$. In contrast, a formula of $Si_xGe_{1-x}$ represents concentrations of at least an order of magnitude greater than doping levels, or more specifically, $0.005 \leq x \leq 0.995$.

In various embodiments, the substrate may include various heterostructures.

The exposed surface 110 of a substrate 100 may be prepared by, for example, cleaning, chemical-mechanical polishing (CMP), planarizing, annealing, etching/defect removal, and/or oxide removal for subsequent processing steps including but not limited to masking, etching, deposition, implantation, and thermal activation.

FIG. 2 is a diagram of a substrate and a surface layer for an electronic device structure according to an exemplary embodiment. The diagram shows a cross-sectional view illustrating the x and z directions of the device structure.

In various embodiments, a layer 200 may be formed on the exposed surface 110 of substrate 100. The layer 200 may be a material different from the material of the substrate 100, or the material at the exposed surface 110. The layer 200 and exposed surface 110 of substrate 100 may form an interface 120, where the layer 200 and exposed surface 110 are in contact. The layer 200 may be continuous and uniform over at least a portion of the substrate surface 110.

The layer 200 may have a thickness, where the thickness may be in the range of about 20 Å to about 500 Å, or about 30 Å to about 300 Å, or about 50 Å to about 250 Å.

In various embodiments, layer 200 may be deposited by physical vapor deposition (PVD), chemical vapor deposition (CVD), atomic layer deposition (ALD), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). In one or more embodiments, layer 200 is deposited by PECVD or LPCVD. The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

FIG. 3 is a diagram of a substrate and a patterned surface layer for an electronic device structure according to an exemplary embodiment. The diagram shows a cross-sectional view illustrating the x and z directions of the device structure.

In one or more embodiments, portions of layer 200, which may be made of an insulator material that provides a mask for etching of the substrate 100, and may be removed, for example by masking and wet etching or reactive ion etching (RIE) to form islands 220 of the material of layer 200 on the substrate 100. It should be noted that not all masking, patterning, and lithography processes are shown, since a person of ordinary skill in the art would recognize where masking and patterning are utilized to form the identified layers and openings, and to perform the identified selective etching processes, as described herein. The layer 200 may be a nitride, for example silicon nitride (SiN) or titanium nitride (TiN) to form a mask with exposed regions between islands 220. In one or more embodiments, layer 200 is a $Si_3N_4$ layer to provide for selective etching of Si. In various embodiments, portions of layer 200 are removed to form islands 220 having sizes in the range of about 100 nm$^2$ to about 100,000 nm$^2$, or in the range of about 1,000 nm$^2$ to about 50,000 nm$^2$, or in the range of about 5,000 nm$^2$ to about 10,000 nm$^2$. The areas 230 between the islands 220, may have dimensions in the range of about 500 nm by about 500 nm, or in the range of about 250 nm by about 250 nm, or in the range of about 100 nm by about 100 nm, or about 60 nm by about 60 nm, where the area may be square or rectangular. In various embodiments, the areas between the islands may have a surface area in the range of about 3600 nm$^2$ to about 250,000 nm$^2$, where the area may be rectangular.

FIG. 4 is a diagram of a substrate with etched recesses and a patterned surface layer for an electronic device structure according to an exemplary embodiment. The diagram shows a cross-sectional view illustrating the x and z directions of the device structure.

In one or more embodiments, a portion of the substrate 100 may be etched to form recessed regions 150 within the substrate 100, where the recessed regions 150 may be utilized to form shallow trench isolation (STI) regions.

FIG. 5 is a diagram of a substrate with recessed regions with a dielectric fill for an electronic device structure according to an exemplary embodiment. The diagram shows a cross-sectional view illustrating the x and z directions of the device structure.

A dielectric material layer 300 may be deposited over the substrate 100 and islands 220 to fill in the recessed regions 150 of the substrate 100. In various embodiments, the dielectric material layer 300 may be silicon oxide ($SiO_2$), silicon oxinitride (SiON), or silicon nitride (SiN), where the chemical composition of the dielectric material layer 300 is different from the chemical composition of the islands 220. The difference in the material of islands 220 and dielectric material layer 300 may provide selective etching rates and/or an etch stop. In various embodiments, the thickness of the deposited dielectric material layer 300 is sufficient to cover the recessed regions 150 and the islands 220, where the height of the dielectric material layer 300 above the recessed region is greater than the height of the substrate and islands 220 above a lowest surface 155 of the recessed regions 150. The dielectric material layer 300 may be conformally deposited in recessed regions 150.

FIG. 6 is a diagram of a substrate with shallow trench isolation (STI) regions of an electronic device structure according to an exemplary embodiment. The diagram shows a cross-sectional view illustrating the x and z directions of the device structure.

The dielectric material layer 300 may be etched back and/or chemically-mechanically polished to form a planar surface 350. The recessed regions 150 filled with the dielectric material layer 300, and bounded by the lowest surface 155 of the recessed regions 150, planar surface 350, and the side walls 180 of substrate 100 and islands 220 form the shallow trench isolation regions 330. In various embodiments, the dielectric material layer 300 may be a deposited $SiO_2$ layer. The thickness of the islands may be greater than the final thickness to allow the surface of islands 220 to be etched or polished back to a final thickness. The STI regions 330 separate the islands 220, and provide electrical insulation between the substrate areas below the islands 220.

FIG. 7 is a diagram of a substrate with exposed substrate regions of an electronic device structure according to an exemplary embodiment. The diagram shows a cross-sectional view illustrating the x and z directions of the device structure.

In one or more embodiments, an island 220 may be removed by etching to expose an underlying portion of substrate 100, while other islands 220 remain on the substrate. Selective etching of one or more islands may be accomplished by wet etching or reactive ion etching. A mask may be formed over specific islands 220 to allow selective removal of one or more islands in one or more separate etching steps.

FIG. 8 is a diagram of a substrate with exposed substrate regions of an electronic device structure according to an exemplary embodiment. The diagram shows a cross-sectional view illustrating the x and z directions of the device structure.

In various embodiments, the substrate 100 below the previously removed island(s) 220 may be etched to decrease the height of the substrate and increase the depth of the first recess 170 between two shallow trench isolation regions 330. The exposed substrate surface 190 at the bottom of first recess 170 (i.e., the first bottom surface) may be suitable for epitaxial growth. The exposed substrate surface 190 may be cleaned and prepared for the epitaxial growth of a drain material or a source material. While embodiments are described with a drain region formed on the substrate, this is for descriptive purposes only and should not be construed as a limitation, as a source region formed on the substrate is contemplated as within the inventive scope.

In various embodiments, the final recess depth of the substrate surface is less than the depth of the adjacent STI regions. The shallow trench isolation regions 330 may have a depth in the range of about 10 nm to about 300 nm, or in the range of about 25 nm to about 250 nm, or in the range of about 50 nm to about 200 nm.

FIG. 9 is a diagram of a substrate with a first drain region of an electronic device structure according to an exemplary embodiment. The diagram shows a cross-sectional view illustrating the x and z directions of the device structure.

In one or more embodiments, a first drain 400 is formed on the surface 190 of the substrate 100 between shallow trench isolation regions 330. The first drain 400 may be epitaxially grown on the surface 190 by CVD, PE-CVD, ALD, PE-ALD, or combinations thereof, and have the crystal orientation of the substrate.

In one or more embodiments, a first drain 400 may be silicon (Si), silicon carbide (SiC), or silicon germanium ($Si_xGe_y$). In various embodiments, first drain 400 may be doped with boron, phosphorus, or carbon to form an n-FET or a p-FET. In one or more embodiments, the first drain 400 may be boron-doped silicon germanium (SiGe—B) or phosphorus-doped silicon carbide (SiC—P). In an embodiments, an n-FET if formed using SiGe, and a p-FET is formed using SiC. In various embodiments, arsenic is not used as a dopant.

In various embodiments, first drain 400 may have a thickness in the range of about 10 nm to about 250 nm, or about 20 nm to about 150 nm, or about 50 nm to about 100 nm. The interface between the substrate 100 and the bottom surface of the first drain 400 can be above the interface between the substrate 100 and the bottom surface of the STI region(s) 330, where the STI regions 330 may be the STI regions adjacent to the first drain 400. In various embodiments, dopants may be added to the first drain 400 in-situ during the epitaxial growth of the drain, or ex-situ by an ion implantation technique. The dopant concentration within <5 nm of the first drain surface may be essentially free (i.e., approximately zero concentration) to enable channel epitaxial growth on the exposed surface of the drain 400.

FIG. 10 is a diagram of a substrate with a hardmask for an electronic device structure according to an exemplary embodiment. The diagram shows a cross-sectional view illustrating the x and z directions of the device structure.

A hardmask 500 may be formed over the first drain 400, shallow trench isolation regions 330, and islands 220. In various embodiments, the hardmask 500 may be an oxide, boride, carbide, or a nitride, where the hardmask 500 is compatible with the drain material. In various embodiments, the hardmask is silicon nitride.

FIG. 11 is a diagram of a substrate with a partially removed hardmask for an electronic device structure according to an exemplary embodiment. The diagram shows a cross-sectional view illustrating the x and z directions of the device structure.

The hardmask 500 may be removed from one or more islands 220 to expose the one or more islands 220 for removal, while protecting first drain 400. Portions of the hardmask 500 may be removed by selectively masking and etching.

FIG. 12 is a diagram of a substrate with exposed substrate regions of an electronic device structure according to an exemplary embodiment. The diagram shows a cross-sectional view illustrating the x and z directions of the device structure.

The island(s) 220 may be removed, where the island material may be wet etched or dry etched to expose the underlying substrate 100.

FIG. 13 is a diagram of a substrate with exposed substrate regions of an electronic device structure according to an exemplary embodiment. The diagram shows a cross-sectional view illustrating the x and z directions of the device structure.

In various embodiments, the substrate 100 below the previously removed island 220 may be etched to decrease the height of the substrate and increase the depth of the second recess 175 between two shallow trench isolation regions 330. After etching, the height of the substrate may be above the interface between the substrate 100 and the neighboring STI regions 330. The exposed substrate surface 195 at the bottom of second recess 175 (i.e., the second bottom surface) may be suitable for epitaxial growth. The exposed substrate surface 195 may be cleaned and prepared for the epitaxial growth of a drain material or a source material.

FIG. 14 is a diagram of a substrate with a second drain region of an electronic device structure according to an exemplary embodiment. The diagram shows a cross-sectional view illustrating the x and z directions of the device structure.

In one or more embodiments, a second drain 600 is formed on the second bottom surface 195 of the substrate 100 between shallow trench isolation regions 330. The second drain 600 may be epitaxially grown on the surface 190 by CVD, PE-CVD, ALD, PE-ALD, or combinations thereof, and have the crystal orientation of the substrate.

In one or more embodiments, a second drain 600 may be silicon (Si), silicon carbide (SiC), or silicon germanium ($Si_xGe_y$). In various embodiments, second drain 600 may be doped with boron, phosphorus, or carbon to form an n-FET or a p-FET. In one or more embodiments, the second drain 600 may be boron-doped silicon germanium (SiGe—B) or phosphorus-doped silicon carbide (SiC—P). In various embodiments, arsenic is not used as a dopant for the drain(s).

In various embodiments, second drain 600 may be made of a different material and/or doped with a different material than first drain 400. The second drain 600 may be an n-type material and first drain 400 may be a p-type material, or second drain 600 may be an p-type material and first drain 400 may be a n-type material.

In various embodiments, second drain 600 may have a thickness in the range of about 10 nm to about 250 nm, or about 20 nm to about 150 nm, or about 50 nm to about 100 nm. The interface between the substrate 100 and the bottom surface of the second drain 600 can be above the interface between the substrate 100 and the bottom surface of the STI region 330, where the STI regions 330 may be the STI regions adjacent to the second drain 600. In various embodiments, dopants may be added to the second drain 600 in-situ during the epitaxial growth of the second drain, or ex-situ by an ion implantation technique. The dopant concentration within <5 nm of the surface of the second drain 600 may be essentially free (i.e., approximately zero concentration) to enable epitaxial channel growth on the exposed surface of the drain 600. The first drain 400 and the second drain 600 may have the same height or different heights. The STI regions 330 may separate first drain 400 from second drain 600 and provide electrical insulation between drain 400 and drain 600.

FIG. 15 is a diagram of a substrate with a hardmask removed from the electronic device structure according to an exemplary embodiment. The diagram shows a cross-sectional view illustrating the x and z directions of the device structure.

The hardmask 500 may be removed from second drain 600 and shallow trench isolation regions 330 by etching. The exposed surfaces of first drain 400 and second drain 600 may be prepared for epitaxial growth of a channel material by cleaning and/or thermal treatment.

FIG. 16 is a diagram of a substrate with a channel material forming the electronic device structure according to an exemplary embodiment. The diagram shows a cross-sectional view illustrating the x and z directions of the device structure.

In one or more embodiments, a channel material 700 is formed on at least a first drain 400 and a second drain 600. The channel material 700 may be grown epitaxially to extend above the top surface(s) of STI regions 330, where excess channel material 700 may be etched or chemically-mechanically polished to provide a smooth, flat surface 710, where the surface 710 of the channel material 700 may be suitable for epitaxial growth.

In one or more embodiments, the channel material 700 may be intrinsic Si, $Si_xGe_y$, GaAs, and InGaAs. The channel material may be epitaxially grown on the exposed surface of first drain 400 and/or second drain 600, where a channel material/drain interface may be formed between drain 400 and/or drain 600 and the channel material. The channel material may be grown simultaneously on first drain 400 and second drain 600. In various embodiments, the interface 720 may have particular electronic properties, for example, improved carrier mobility and transport characteristics, based on the crystal structure and orientation of first drain 400 and/or second drain 600, for example, a deposited $Si_xGe_y$ may be strained due to crystal lattice mismatch at the channel material/drain interface 720.

FIG. 17 is a diagram of a substrate with fin channels of an electronic device structure according to an exemplary embodiment. The diagram shows a cross-sectional view illustrating the x and z directions of the device structure.

The channel material may be masked and/or etched to produce troughs 740 between a plurality of channel fins 750, where the channel fins 750 may be pillars with a proximal end adjacent the surface of a first drain 400 or second drain 600 and extending perpendicularly from the surface of first drain 400 or second drain 600. The troughs 740 may be formed between the fin channels 750 by RIE. The channel fins 750 may, thereby, be associated with the first drain or with the second drain.

In various embodiments, a single section of channel material 700 may be etched to produce from 1 to 25 fin channels, or 1 to 15 fin channels, or 1 to 10 fin channels, 2 to 10 fin channels, or 1 to 5 fin channels, or 2 to 5 fin channels, or 2-3 fin channels. The size of the section of channel material 700 may be based on the predetermined number of fin channels to be formed from the section of channel material, where the size of the section of channel material is determined by the size of the first drain 400 or second drain 600, which depends on the size of the islands 220. In various embodiments, a plurality of fin channels 750 extend from the same drain 400 or from the same drain 600, such that current passing through first drain 400 or second drain 600 is distributed to the plurality of fin channels 750 formed thereon.

In embodiments in which a single fin channel is formed on first drain 400 or second drain 600, troughs 740 may be formed between the sides of fin channel 750 and side walls of STI regions 330. In embodiments in which multiple fin channels 750 are formed on first drain 400 or second drain 600, troughs 740 may be formed between the sides of fin channel 750 facing the side walls of the STI regions 330.

The height of the fin channel 750 in the z direction may be in the range of about 30 nm to about 400 nm, or in the range of about 50 nm to about 300 nm, or in the range of about 75 nm to about 200 nm. In various embodiments, the width of the fin channel 750 in the x direction may be in the range of about 5 nm to about 30 nm, or about 10 nm to about 20 nm. In various embodiments, the aspect ratio of the fin channel 750 may be in the range of about 3 to about 40, or in the range of about 5 to about 20, or in the range of about 7 to about 10. In various embodiments, the fin channel 750 may have a length in the y direction in the range of about 10 nm to about 2000 nm, or in the range of about 20 nm to about 1000 nm, or in the range of about 25 nm to about 500 nm, where the length in the y direction is greater than the width in the x direction. In a non-limiting example, a fin channel 750 may have a width in the x direction of 5 nm, a length in the y direction of 100 nm, and a height in the z direction of about 200 nm.

The number and size of fin channels 750 to be formed may be based on the intended current handling capacity of the electronic device structure. The number and size of the fin channels is correlated with the size of the islands 200, where more or larger fin channels 750 may be formed on larger area drains.

FIG. 18 is a diagram of a substrate with a low-k dielectric material forming the electronic device structure according to an exemplary embodiment. The diagram shows a cross-sectional view illustrating the x and z directions of the device structure.

On one or more embodiments, a first low-k dielectric material 800 is formed over the fin channels 750 and in the troughs 740 to form low-k spacers isolating the channel fins 750. The first low-k dielectric material 800 may bury the shallow trench isolation regions 330. In various embodiments, the first low-k spacer material may be SiBCN, SiOCN, SiN or combinations thereof.

FIG. 19 is a diagram of a substrate with a low-k dielectric material forming the electronic device structure according to an exemplary embodiment. The diagram shows a cross-sectional view illustrating the x and z directions of the device structure.

A portion of the first low-k dielectric material 800 may be removed by chemical-mechanical polishing to provide a flat, uniform surface 810. The height of the first low-k dielectric material 800 may be reduced to the height of the fin channels 750 by chemical-mechanical polishing to form a smooth planar surface.

FIG. 20 is a diagram of a substrate with a low-k dielectric material forming the electronic device structure according to an exemplary embodiment. The diagram shows a cross-sectional view illustrating the x and z directions of the device structure.

The first low-k dielectric material 800 may be removed to a predetermined depth leaving at least a portion of the fin channels 750 exposed above the first low-k dielectric spacers 820. In various embodiments, the top surface of the first low-k dielectric spacer 820 is co-planar with the top surface of the shallow trench isolation regions 330. The first low-k dielectric spacer(s) 820 may be adjacent to at least a portion of each of the fin channels 750.

In various embodiments, a work function metal (WFM) layer 900 is formed over exposed portions of the fin channels 750, STI region 330, and first low-k dielectric spacers 820, where the work function metal layer 900 may be conformally deposited. The WFM may include multiple deposited layers. In various embodiments, the WFM layer 900 may be deposited by ALD or PE-ALD.

In various embodiments the WFM layer 900 is composed of at least one high-k oxide layer and at least one gate metal layer, where the high-k oxide may be $HfO_2$, $HfSiO_4$, HfSiON, $La_2O_3$, $Ta_2O_5$, $ZrO_2$, and/or $SrTiO_3$, or combinations thereof, and the gate metal may be TiN, HfN, TaN, TiC, TaC, HfC, WC, TiAlN, or combinations thereof, where the WFM layer 900 may have multiple material layers. In various embodiments, the gate metal may be a metal nitride, where the metal nitride may be TiN, HfN, TaN, TiAlN, or combinations thereof. In various embodiments, a WFM inter-layer dielectric (ILD) is the high-k oxide formed prior to the gate metal. In one or more embodiments, the high-k oxide layer is adjacent to the fin channel 750 and forms an interface with the vertical side surfaces of the fin channel 750. A high-k oxide layer may be formed before the gate metal layer, where the high-k oxide layer is directly on at least a portion of fin channel 750.

FIG. 21 is a diagram of a substrate with a WFM layer of an electronic device structure according to an exemplary embodiment. The diagram shows a cross-sectional view illustrating the x and z directions of the device structure.

The work function metal layer 900 may be selectively removed to leave work function metal caps 920 on the exposed top and side surfaces of the fin channels 750. The WFM layer 900 may be removed by masking and etching each of the high-k oxide and metal nitride materials. In various embodiments, the work function metal caps 920 may have a thickness of less than about 15 nm, where the thickness of the WFM cap 920 is a sum of at least one high-k oxide layer thickness and the at least one metal nitride layer thickness.

FIG. 22 is a diagram of a substrate with WFM caps of an electronic device structure according to an exemplary embodiment. The diagram shows a cross-sectional view illustrating the x and z directions of the device structure.

The top portion of the work function metal caps 920 may be removed by etching or polishing to reveal the tops of the fin channels 750 leaving the sides of the WFM cap 920 on each side of the fin channels 750. In various embodiments, the WFM caps 920 may have a thickness in the range of about 5 nm to about 15 nm, or a thickness in the range of about 7 nm to about 10 nm, or a thickness of about 7 nm.

FIG. 23 is a diagram of a substrate with gate material forming an electronic device structure according to an exemplary embodiment. The diagram shows a cross-sectional view illustrating the x and z directions of the device structure.

A gate material 1000 may be formed over the tops of the fin channels 750 and work function metal caps 920, where the gate material 1000 fills in the troughs 740 between the WFM caps 920 and between the WFM caps 920 and STI regions 330. The STI regions 330 and the first low-k dielectric spacers 820 may be buried beneath the gate material 1000. In various embodiments, the gate material 1000 is a metal, where the metal may be tungsten (W), tungsten nitride (WN) or combinations thereof. In one or more embodiments, the gate material 1000 is tungsten (W). The gate material 1000 may be deposited by CVD or PE-CVD.

In one or more embodiments, the gate material 1000 and WFM cap 920 is separated from the first drain 400 and/or second drain 600 by the first low-k dielectric spacers 820, which may also provide isolation of the first drain 400 and/or second drain 600 from the conducting layers of the gate material 1000 and WFM cap 920.

FIG. 24 is a diagram of a substrate with a reduced height gate material forming an electronic device structure according to an exemplary embodiment. The diagram shows a cross-sectional view illustrating the x and z directions of the device structure.

A portion of the gate material 1000 may be removed by chemical-mechanical polishing to provide a flat, uniform surface, where the top surface of the gate material 1000 may be coplanar with the top surfaces of the fin channels 750.

Figure 25:
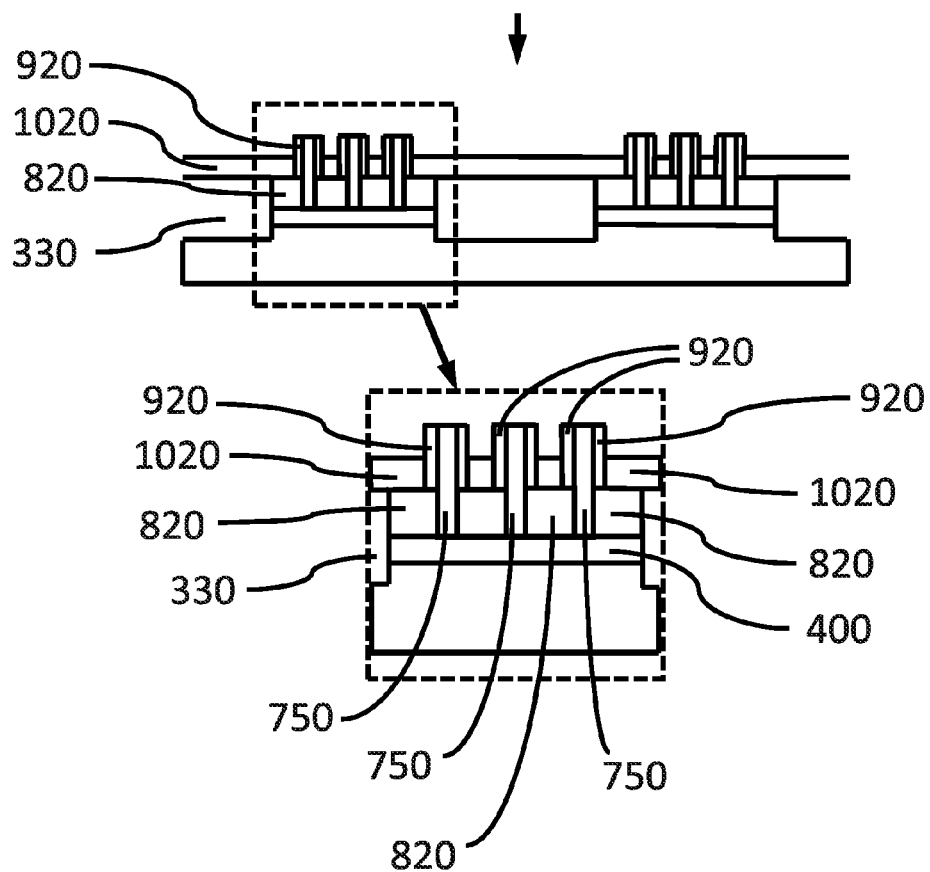
FIG. 25 is a cross-sectional view and enlarged inset view of a substrate with a reduced height gate material forming an electronic device structure according to an exemplary embodiment.

FIG. 25 is a diagram and enlarged inset view of a substrate with a reduced height gate material forming an electronic device structure according to an exemplary embodiment. The diagram shows a cross-sectional view illustrating the x and z directions of the device structure.

The gate material 1000 may be removed to a predetermined depth leaving at least a portion of the fin channels 750 exposed above the gate material 1000. A height of gate material is left to form gate precursors 1020. In various embodiments the height of the gate precursors 1020 above the surface of the low-k dielectric spacer 820 may be in the range of about 15 nm to about 300 nm, or about 15 nm to about 100 nm, or about 15 nm to about 50 nm. In various embodiments, the height of the gate precursor 1020 in the z direction is related to height of the fin channel, where the height of the gate precursor is less than the height of the of the fin channel 750 in the z direction. In various embodiments, the height of the gate precursor 1020 may be less than or equal to the height of the WFM cap 920, where the height of the WFM cap 920 may be subsequently reduced to be about equal with the height of the gate precursor 1020.

Figure 26:
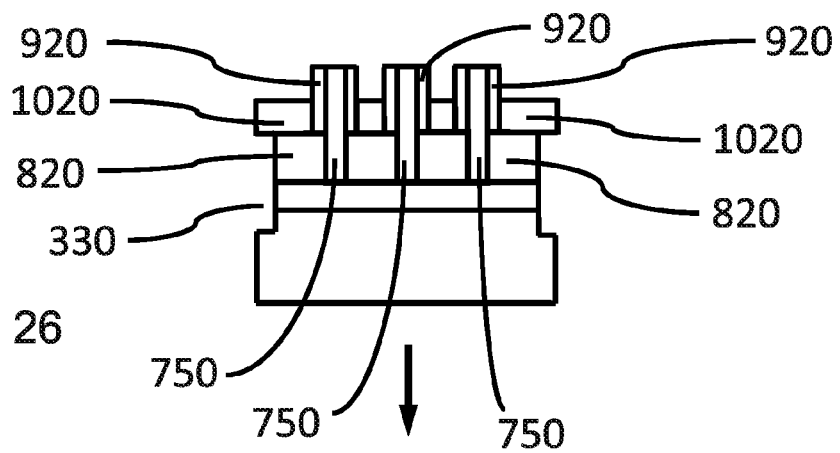
FIG. 26 is an enlarged inset cross-sectional view of a substrate with a reduced height gate material forming an electronic device structure according to an exemplary embodiment.

FIG. 26 is an enlarged inset view of a substrate with a reduced height gate material forming an electronic device structure according to an exemplary embodiment. The diagram shows a cross-sectional view illustrating the x and z directions of the device structure.

The enlarged inset view of FIG. 25 illustrating a drain and fin channel assembly is also shown in FIG. 26. The inset shows three fin channels extending from and electrically coupled to the same first drain 400, and WFM caps 920 with a greater height than the gate precursors 1020. The WFM cap electrically separates the gate precursor 1020 from the fin channel 750. WFM caps 920 and gate precursors 1020 are insulated from first drain 400 by the first low-k dielectric spacers 820 and STI region(s) 330. The tungsten of the gate precursor 1020 is isolated from the fin channel 750 by the high-k dielectric layer of the WFM caps 920.

Figure 27:
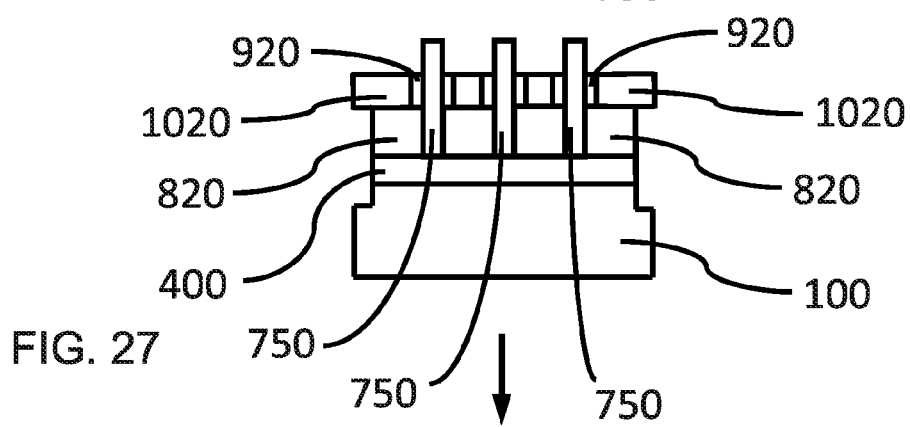
FIG. 27 is an enlarged inset cross-sectional view of a substrate with a reduced height gate precursor and WFM cap forming an electronic device structure according to an exemplary embodiment.

FIG. 27 is an enlarged inset view of a substrate with a reduced height gate precursor and WFM cap forming an electronic device structure according to an exemplary embodiment. The diagram shows a cross-sectional view illustrating the x and z directions of the device structure.

In various embodiments, the WFM cap 920 above the level of the gate precursor 1020 may be removed to expose the sidewalls of the fin channel 750 above the top surface of the gate precursor 1020, where the WFM cap 920 may be removed by etching. After removal of the portions of the WFM caps 920 extending above the gate precursor 1020, the WFM caps 920 and gate precursor 1020 may have about the same height. In various embodiments, the fin channel 750 extends about 25 nm to about 100 nm above the WFM caps 920 and gate precursor 1020, or in the range of about 35 nm to about 75 nm above the WFM caps 920 and gate precursor 1020.

Figure 28:
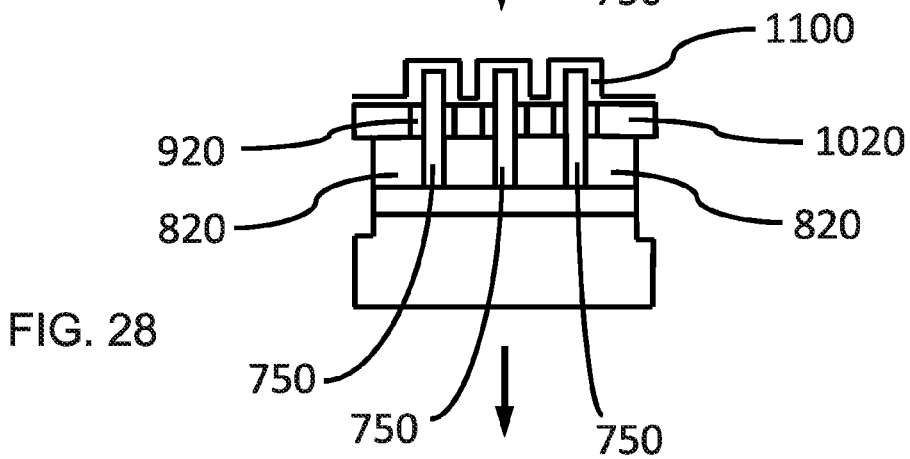
FIG. 28 is an enlarged inset cross-sectional view of a substrate with a disposable spacer forming an electronic device structure according to an exemplary embodiment.

FIG. 28 is an enlarged inset view of a substrate with a disposable spacer forming an electronic device structure according to an exemplary embodiment. The diagram shows a cross-sectional view illustrating the x and z directions of the device structure.

A disposable spacer material 1100 may be formed over the exposed surfaces of the fin channels 750, where the disposable spacer material may be a thin conformal oxide or nitride layer (e.g., $SiO_2$, SiN). In various embodiments, the disposable spacer material 1100 may be formed by an ALD or PE-ALD process. The thickness of the disposable spacer material 1100 at least on the sidewalls of the fin channel 750 can be sufficient to extend past the thickness of the WFM cap 920 to define the thickness of a gate 1030, where for example, if the WFM cap 920 has a thickness of about 7 nm in the x and y directions, then the thickness of the disposable spacer material 1100 is in the range of about 9 to about 12 nm, so the thickness of the gate may be in the range of about 2 nm to about 5 nm. In various embodiments, the thickness of the disposable spacer caps 1120 is greater than the thickness of the work function metal cap 920, so an overhang extending horizontally over the gate precursor(s) 1020 is formed. In various embodiments, the thickness of the deposited disposable spacer material 1100 may be in the range of 2 nm to 3 nm greater than the thickness of the WFM caps 920.

Figure 29:
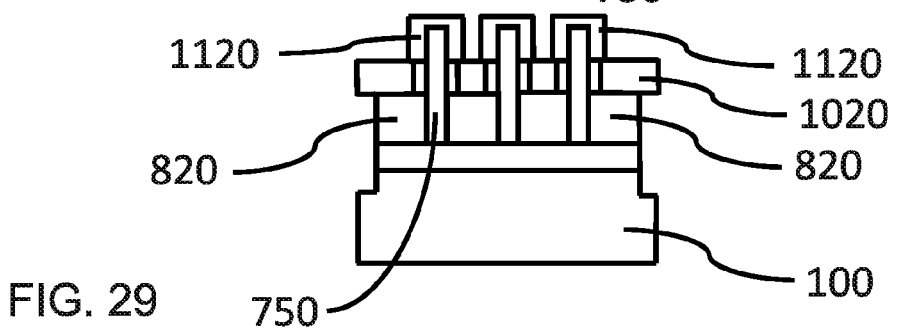
FIG. 29 is an enlarged inset cross-sectional view of a substrate with a disposable spacer forming an electronic device structure according to an exemplary embodiment.

FIG. 29 is an enlarged inset view of a substrate with a disposable spacer forming an electronic device structure according to an exemplary embodiment. The diagram shows a cross-sectional view illustrating the x and z directions of the device structure.

The disposable spacer material 1100 on the gate precursor 1020 surfaces may be removed to expose at least a portion of the gate precursors 1020 between the fin channels 750, while leaving the disposable spacer material on the side walls of the fin channels 750. The disposable spacer material 1100 is removed from the horizontal surfaces between the vertical fin channels 750 to form disposable spacer caps 1120 over the exposed surfaces of the vertical fin channels 750. The disposable spacer caps 1120 may be masks for subsequent etching of at least a portion of gate precursors 1020 to form gates 1030.

Figure 30:
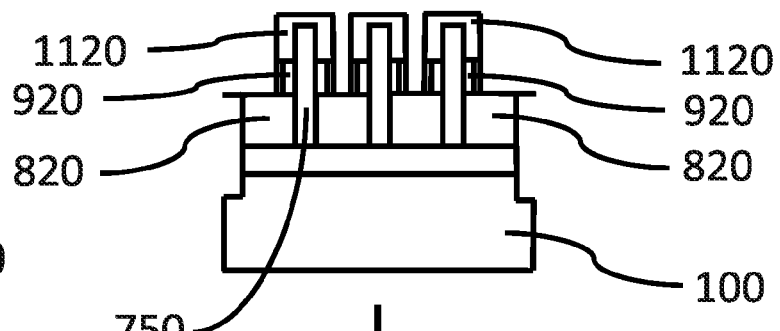
FIG. 30 is an enlarged inset cross-sectional view of a substrate with a disposable spacer forming an electronic device structure according to an exemplary embodiment.

FIG. 30 is an enlarged inset view of a substrate with a disposable spacer forming an electronic device structure according to an exemplary embodiment. The diagram shows a cross-sectional view illustrating the x and z directions of the device structure.

In one or more embodiments, the portion of the gate precursors 1020 exposed between the disposable spacer caps 1120 may be removed, for example by RIE, to form gates 1030, where the gates 1030 may have a thickness in the range of about 2 nm to about 5 nm, or in the range of about 2 nm to about 3 nm. Gates 1030 may be formed adjacent to the work function metal cap 920, where the gates 1030 may form an interface with the gate metal layer of the WFM cap 920, and where the gate metal layer may be a metal nitride layer. The exposed portion of the gate precursors 1020 may be removed down to the surface of the first low-k dielectric spacers 820, where the material of the first low-k dielectric spacers 820 may act as an etch stop. In various embodiments, gates 1030 may have a height in the z direction of about 20 nm to about 300 nm, or about 50 nm to about 200 nm, or about 75 nm to about 100 nm, where the height of the gates 1030 is less than the height of the WFM cap 920 and fin channels 750.

Figure 31:
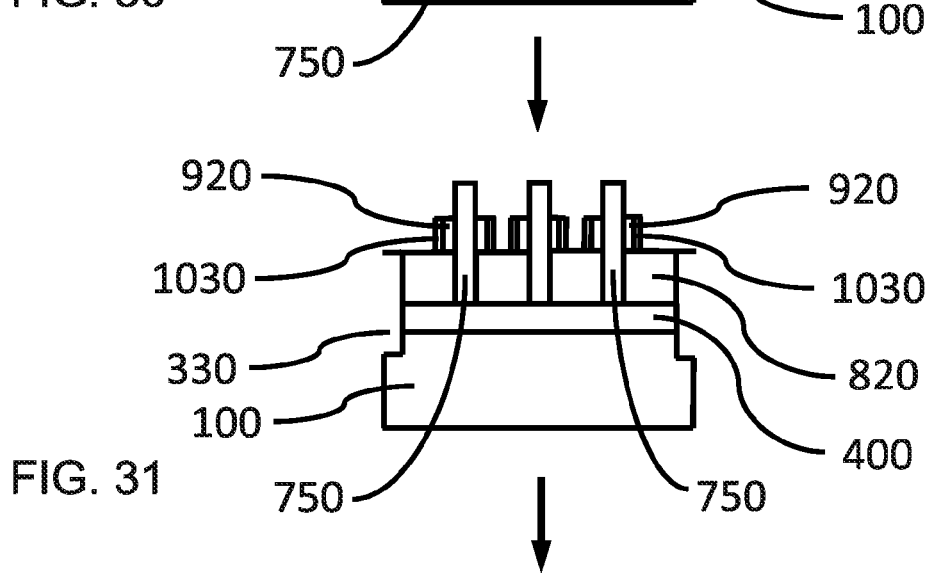
FIG. 31 is an enlarged inset cross-sectional view of a substrate with an exposed fin channel and a gate structure forming an electronic device structure according to an exemplary embodiment.

FIG. 31 is an enlarged inset view of a substrate with an exposed fin channel and a gate structure forming an electronic device structure according to an exemplary embodiment. The diagram shows a cross-sectional view illustrating the x and z directions of the device structure.

In various embodiments, the disposable spacer caps 1120 may be removed to expose the distal end portion of the fin channels 750, where the disposable spacer caps 1120 may be removed by etching. The gate 1030 and WFM cap 920 form a gate structure with the fin channel 750 for control of current through the fin channel 750, where the gate structure may be on four sides and surround the fin channel 750. In various embodiments, the gate structure may have a height in the range of about 20 nm to about 300 nm, or about 50 nm to about 200 nm, or about 75 nm to about 100 nm.

Figure 32:
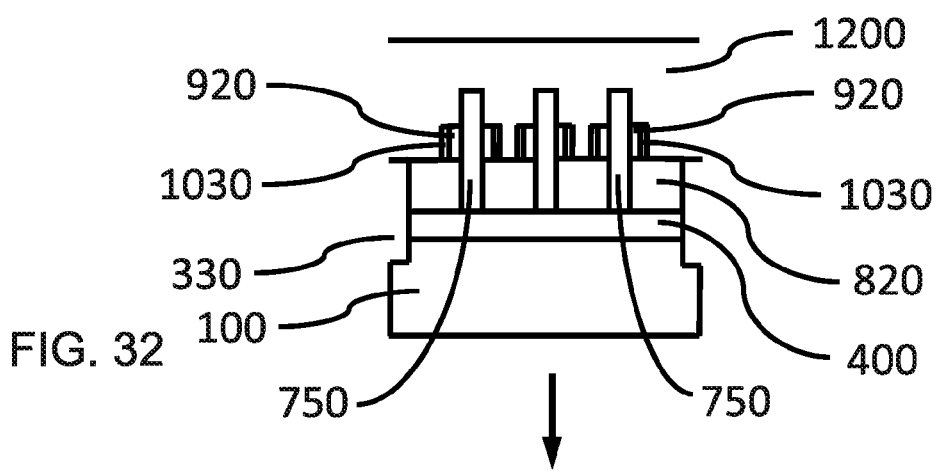
FIG. 32 is an enlarged inset cross-sectional view of a substrate with a gate structure and low-k dielectric material forming an electronic device structure according to an exemplary embodiment.

FIG. 32 is an enlarged inset view of a substrate with a gate structure and low-k dielectric material forming an electronic device structure according to an exemplary embodiment. The diagram shows a cross-sectional view illustrating the x and z directions of the device structure.

In various embodiments, a second low-k dielectric material 1200 may be formed over the exposed distal end portion of the fin channels 750 and in the spaces between the gates 1030. In various embodiments, the second low-k dielectric material 1200 may be the same as the first low-k dielectric material 800 formed adjacent to the first drain 400 and the second drain 600. The second low-k dielectric material 1200 may be an oxide. In various embodiments, the second low-k dielectric material 1200 may be conformally deposited.

Figure 33:
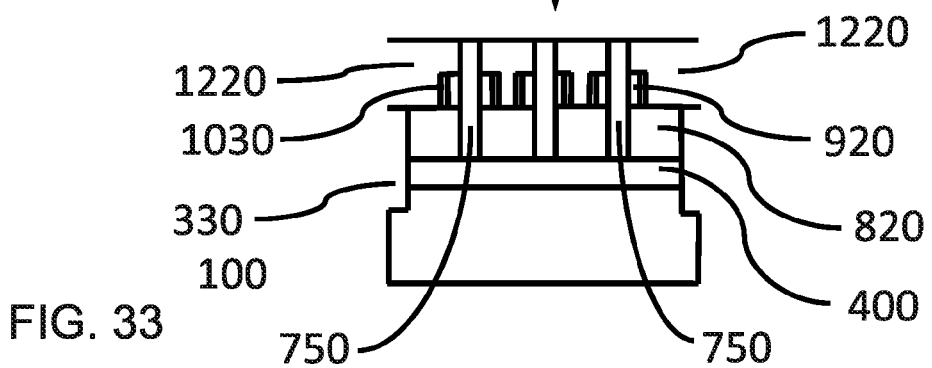
FIG. 33 is an enlarged inset cross-sectional view of a substrate with a gate structure and low-k dielectric material forming an electronic device structure according to an exemplary embodiment.

FIG. 33 is an enlarged inset view of a substrate with a gate structure and low-k dielectric material forming an electronic device structure according to an exemplary embodiment. The diagram shows a cross-sectional view illustrating the x and z directions of the device structure.

The second low-k dielectric material 1200 may be removed by etching or chemical-mechanical polishing to the level of the top of the fin channels 750 to form second low-k dielectric spacers 1220 between the fin channels 750. The second low-k dielectric spacers 1220 may isolate the fin channels from each other and the other neighboring components. In various embodiments, the second low-k dielectric spacers 1220 may be made of the same material as the first low-k dielectric spacers 820, where the first low-k dielectric spacers 820 and second low-k dielectric spacers 1220 can have essentially the same electrical properties.

Figure 34:
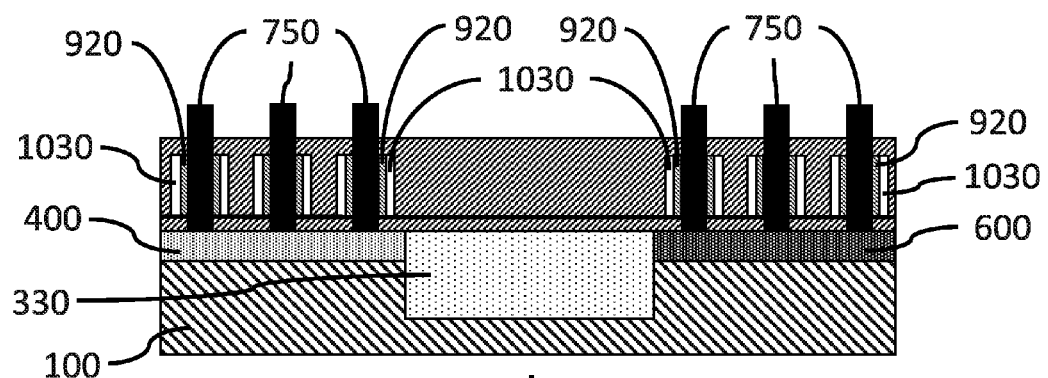
FIG. 34 is a cross-sectional view of a substrate with low-k dielectric spacers and exposed fin channels of an electronic device structure according to an exemplary embodiment.

FIG. 34 is a diagram of a substrate with low-k dielectric spacers and exposed fin channels of an electronic device structure according to an exemplary embodiment. The diagram shows a cross-sectional view illustrating the x and z directions of the device structure.

The height of the second low-k dielectric spacers 1220 may be reduced to expose a portion of the distal end of the fin channels 750. The height of the second low-k dielectric spacers 1220 may be reduced by etching.

Figure 35:
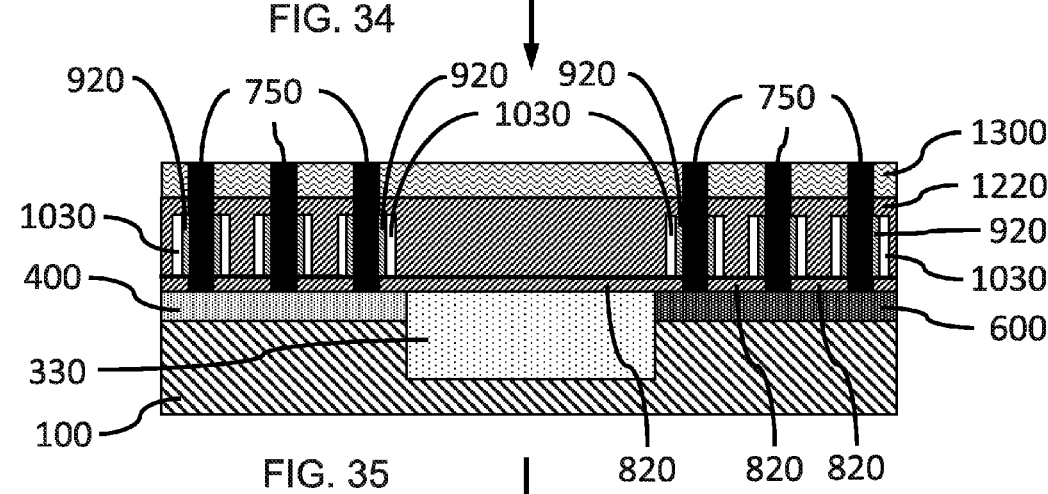
FIG. 35 is a cross-sectional view of a substrate with an inter-layer dielectric of an electronic device structure according to an exemplary embodiment.

FIG. 35 is a diagram of a substrate with an inter-layer dielectric of an electronic device structure according to an exemplary embodiment. The diagram shows a cross-sectional view illustrating the x and z directions of the device structure.

An inter-layer dielectric (ILD) material layer 1300 may be formed over the distal end of the fin channels 750 to provide electrical insulation between the fin channels 750. In various embodiments, the inter-layer dielectric is $SiO_2$. In various embodiments, the inter-layer dielectric is not $Si_3N_4$. The $SiO_2$ may be deposited over the second low-k dielectric spacers 1220 and the exposed portions of the distal end of the fin channels 750, where the ILD material layer 1300 may be conformally deposited. A portion of the inter-layer dielectric (ILD) material layer 1300 may be removed by chemical-mechanical polishing to provide a flat, uniform surface, where the top surface of the inter-layer dielectric (ILD) material layer 1300 may be coplanar with the tops of the fin channels 750. In various embodiments, the ILD material is different from the material of the second low-k dielectric spacers 1220.

Figure 36:
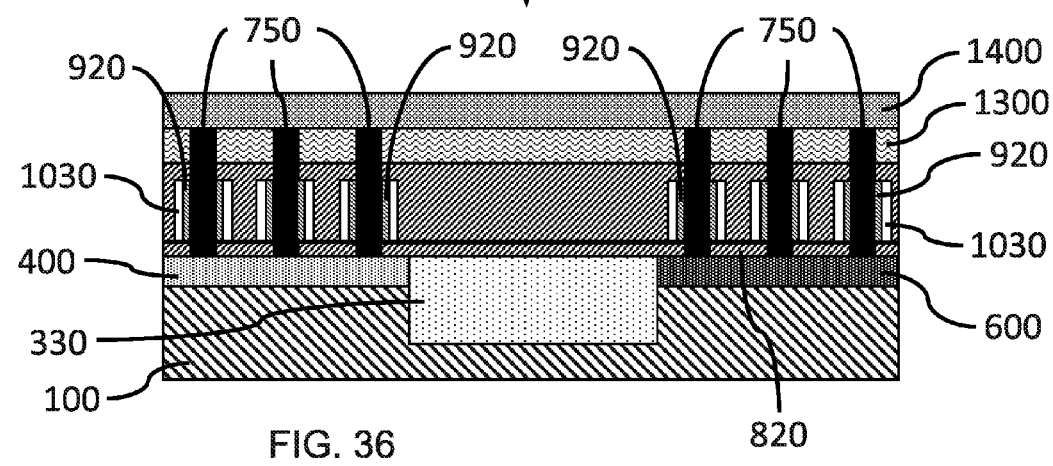
FIG. 36 is a cross-sectional view of a substrate with an inter-layer dielectric and hardmask of an electronic device structure according to an exemplary embodiment.

FIG. 36 is a diagram of a substrate with an inter-layer dielectric and hardmask of an electronic device structure according to an exemplary embodiment. The diagram shows a cross-sectional view illustrating the x and z directions of the device structure.

A hardmask 1400 may be formed over the inter-layer dielectric material layer 1300. The hardmask may be titanium nitride (TiN), $SiO_2$, $Al_2O_3$, silicon nitride (SiN), or combinations thereof. In various embodiments, the hardmask 1400 is SiN.

Figures 37, 38, 39:
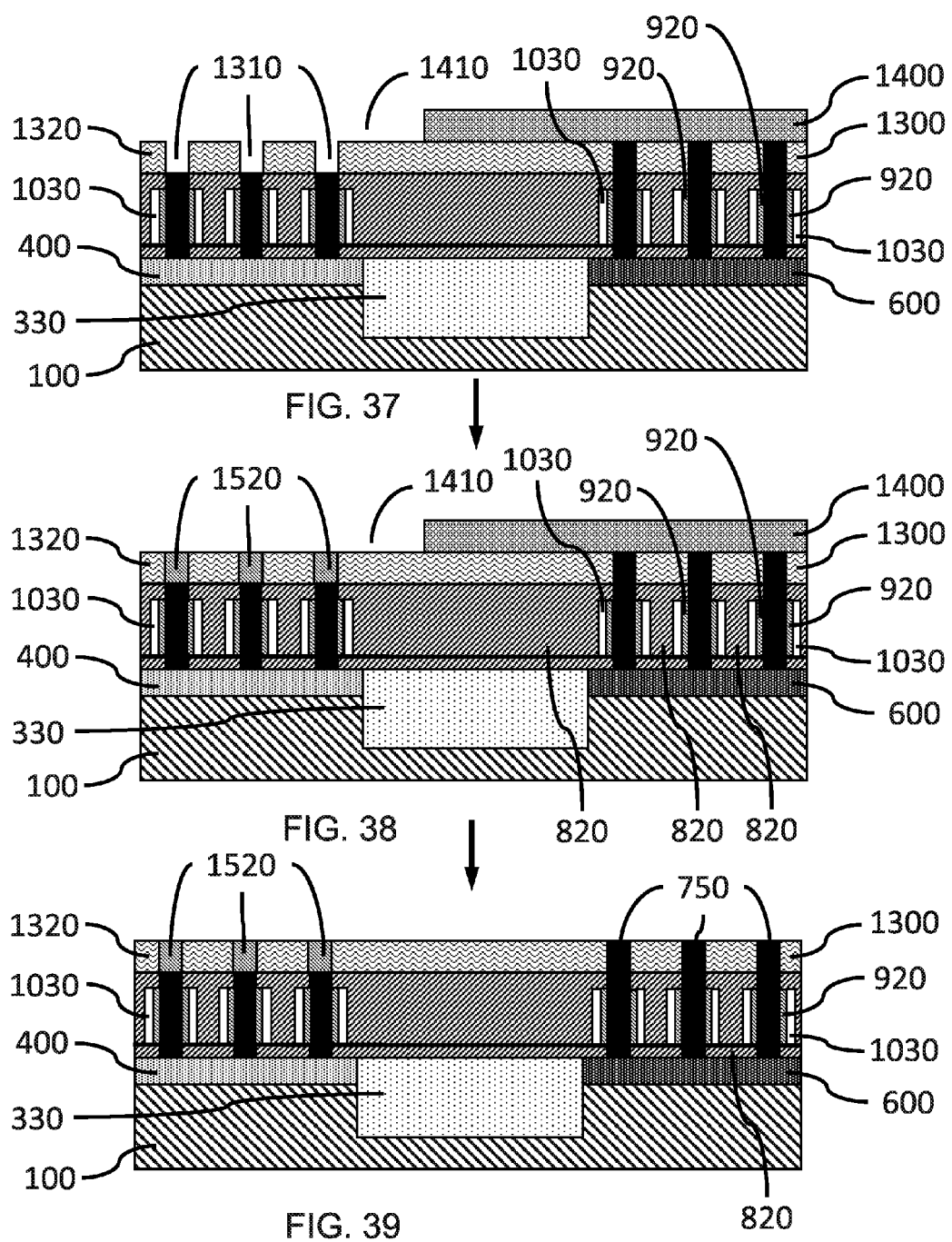
FIG. 37 is a cross-sectional view of a substrate with an inter-layer dielectric and a partially removed hardmask of an electronic device structure according to an exemplary embodiment.
FIG. 38 is a cross-sectional view of a substrate with an inter-layer dielectric and sources of an electronic device structure according to an exemplary embodiment.
FIG. 39 is a cross-sectional view of a substrate with an inter-layer dielectric and removed hardmask of an electronic device structure according to an exemplary embodiment.

FIG. 37 is a diagram of a substrate with an inter-layer dielectric and a partially removed hardmask of an electronic device structure according to an exemplary embodiment. The diagram shows a cross-sectional view illustrating the x and z directions of the device structure.

A portion of the hardmask 1400 may be removed to expose the tops of the fin channels 750 and inter-layer dielectric material layer 1300, where the hardmask may be removed by masking and/or etching. The exposed tops of the fin channels 750 may be etched to reduce the height of the fin channels. In various embodiments, the top surface of fin channels 750 may be approximately co-planar with the interface between the inter-layer dielectric material layer 1300 and second low-k dielectric spacers 1220.

FIG. 38 is a diagram of a substrate with an inter-layer dielectric and sources of an electronic device structure according to an exemplary embodiment. The diagram shows a cross-sectional view illustrating the x and z directions of the device structure.

In various embodiments, a portion of the fin channels 750 may be removed to form openings 1310 in the inter-layer dielectric material layer 1300, where the remaining inter-layer dielectric material layer 1300 forms inter-layer dielectric spacers 1320 between the openings 1310. Portions of the inter-layer dielectric material layer 1300 may be removed to form the openings 1310 by masking and etching the ILD material layer, as would be known in the art.

A source material may be formed in the openings 1310 to form first sources 1520. In various embodiments, the first sources 1520 may be epitaxially grown on the top surface of the fin channel 750, where first sources 1520 may have the same crystal structure and orientation as the underlying fin channel 750. The first source may be Si, SiGe, SiC, or SiP, where the first source may be doped with boron, phosphorus, or carbon. In various embodiments, the dopant is not arsenic. Growth of the source material may be done as a single layer or as multiple deposited layers having varying dopant levels. In various embodiments, the first source(s) 1520 have the same doping as the first drain 400. The sources 1520 on each of the fin channels 750 associated with the first drain 400 have the same crystal orientation as the first bottom surface 190 to provide predetermined electrical properties (e.g., carrier mobility).

FIG. 39 is a diagram of a substrate with an inter-layer dielectric and removed hardmask of an electronic device structure according to an exemplary embodiment. The diagram shows a cross-sectional view illustrating the x and z directions of the device structure.

The remaining hardmask 1400 may be removed from the surface of the ILD material layer 1300, for example, by selective etching.

Figure 40:
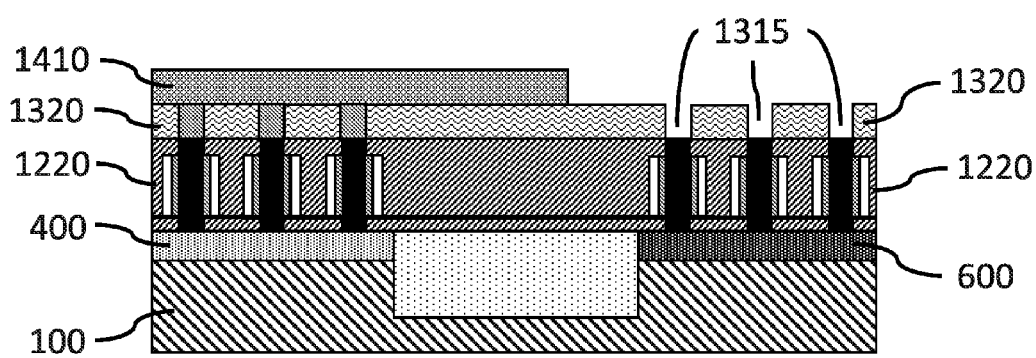
FIG. 40 is a cross-sectional view of a substrate with an inter-layer dielectric and a partially removed hardmask of an electronic device structure according to an exemplary embodiment.

FIG. 40 is a diagram of a substrate with an inter-layer dielectric and a partially removed hardmask of an electronic device structure according to an exemplary embodiment. The diagram shows a cross-sectional view illustrating the x and z directions of the device structure.

In one or more embodiments, a new hardmask 1410 may be formed over the first sources 1520 and sections of ILD material layer 1300, and a portion of the hardmask 1410 removed to expose the previously unexposed top surfaces of the fin channels 750 and inter-layer dielectric material layer 1300.

A portion of the fin channels 750 may be removed to form openings 1315 in the inter-layer dielectric material layer 1300, where the remaining inter-layer dielectric material layer 1300 forms inter-layer dielectric spacers 1320 between the openings 1315. The exposed tops of the fin channels 750 may be etched to reduce the height of the fin channels. In various embodiments, the top surface of fin channels 750 may be approximately co-planar with the interface between the inter-layer dielectric material layer 1300 and second low-k dielectric spacers 1220.

Figure 41:
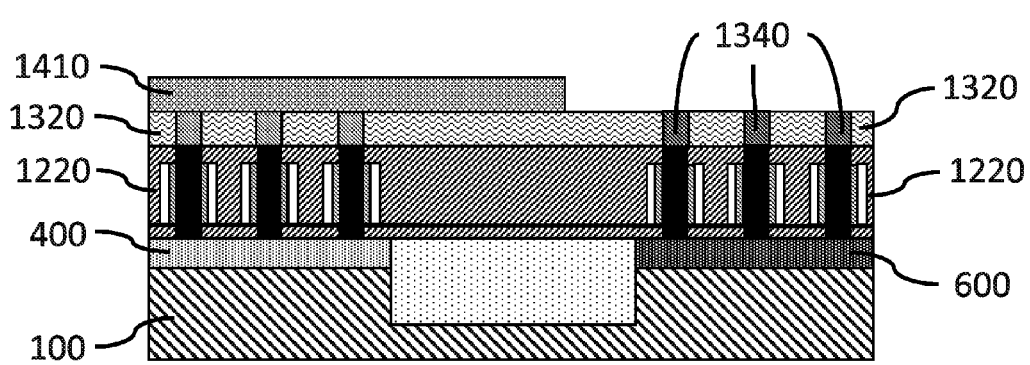
FIG. 41 is a cross-sectional view of a substrate with an inter-layer dielectric and sources of an electronic device structure according to an exemplary embodiment.

FIG. 41 is a diagram of a substrate with an inter-layer dielectric and sources of an electronic device structure according to an exemplary embodiment. The diagram shows a cross-sectional view illustrating the x and z directions of the device structure.

Source material may be formed in the openings 1310 to form second sources 1540. In various embodiments, the second source(s) 1540 may be epitaxially grown on the top surface of the fin channel(s) 750, where second sources 1540 may have the same crystal structure and orientation as the underlying fin channel 750. The second source(s) may be Si, SiGe, SiC, or SiP, where the second source may be doped with boron, phosphorus, or carbon. In various embodiments, the dopant is not arsenic. Growth of the source material may be done as a single layer or as multiple deposited layers having varying dopant levels. In one or more embodiments, the material of the second sources 1540 is different than the material of the first sources 1520. In various embodiments, the second source(s) 1540 have the same doping as the second drain 600. The sources 1540 on each of the fin channels 750 associated with the second drain 600 have the same crystal orientation as the second bottom surface 195 to provide predetermined electrical properties (e.g., carrier mobility).

Figure 42:
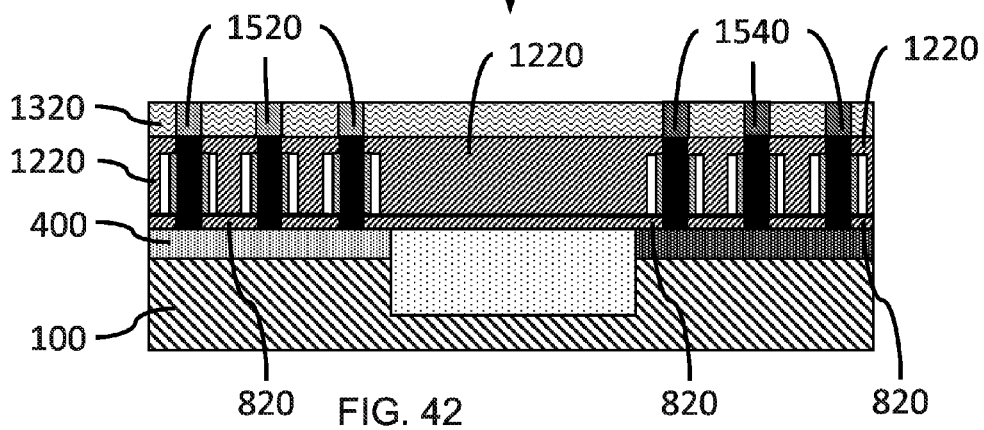
FIG. 42 is a cross-sectional view of a substrate with an inter-layer dielectric and removed hardmask of an electronic device structure according to an exemplary embodiment.

FIG. 42 is a diagram of a substrate with an inter-layer dielectric and removed hardmask of an electronic device structure according to an exemplary embodiment. The diagram shows a cross-sectional view illustrating the x and z directions of the device structure.

In various embodiments, the remaining portion of hardmask 1410 may be removed. The exposed surface of sources 1520, sources 1540, and inter-layer dielectric spacers 1320 may be chemically-mechanically polished. The surface may be cleaned as known in the art.

In one or more embodiments, a complimentary pair of FETs are formed from first drain 400, fin channels 750 and first source 1520, and second drain 600, fin channels 750, and second source 1540. In various embodiments, first drain 400 and first source 1520 form an n-finFET with an intrinsic fin channel 750, and second drain 600 and second source 1540 form a p-finFET with an intrinsic fin channel 750. Gates 1030 for each complimentary pair of FETs may be electrically coupled. Corresponding finFETs may be coupled to form a complementary metal oxide semiconductor (CMOS) transistor.

FIG. 43 is a top view of a substrate with a drain and a plurality of fin channels of an electronic device structure according to an exemplary embodiment, which shows a cross-sectional view illustrating the x and y directions of the device structure.

In one or more embodiments, a plurality of vertical fin channels 750 are epitaxially grown on a first drain 400 deposited on substrate 100. An opening may be formed in intervening layers and filled with a conductive material to form a first drain contact 1600 with the first drain 400, where the first drain contact may be laterally offset from the fin channels 750.

FIG. 44 is a top view of a substrate with drain contacts, gate contacts, and source contacts of an electronic device structure according to an exemplary embodiment, which shows a cross-sectional view illustrating the x and y directions of the device structure.

In one or more embodiments, a WFM cap 920 and a gate 1030 are formed around the plurality of vertical fin channels 750, where the WFM cap 920 and gate 1030 form a collar around the fin channel(s) 750 that covers at least a portion of the height of the fin channel(s) 750. An opening may be formed in intervening layers and filled with a conductive material to form a first source contact 1650 with a first source 1520 below the first source contact 1650. An opening may be formed in intervening layers and filled with a conductive material to form a first gate contact 1670, where the first gate contact 1670 may be in electrical contact with the side walls of the gates 1030. A first gate contact 1670 may be coupled with a second gate contact to form a CMOS.

FIG. 45 is a side view of a fin channel assembly with drain contacts, gate contacts, and source contacts of an electronic device structure according to an exemplary embodiment, which shows a cross-sectional view illustrating the y and z directions of the device structure. The vertical arrangement of the drain, fin channel, and source allows current to flow in a direction perpendicular to the substrate through the finFet device. Current may pass vertically through each of the sources 1520 or 1540 to the fin channels associated with drain 400 or drain 600 and to drain 400 or drain 600 respectively.

In one or more embodiments, the first drain contact 1600, first gate contact 1670, and first source contact 1650 may extend vertically from the respective drain, source, and gate layers to a wiring level. The contacts may include vias filled with a conformally deposited metal to form electrical leads to the wiring level.

FIG. 46 is a side view of a fin channel assembly showing multiple layers of an electronic device structure according to an exemplary embodiment, which shows a cross-sectional view illustrating the y and z directions of the device structure.

In one or more embodiments, the first drain contact 1600, first gate contact 1670, and first source contact 1650 may extend vertically through a first low-k dielectric spacers 820, a second low-k dielectric spacer 1220, and/or an inter-layer dielectric spacer 1320 to a wiring level, where the filled vias may intersect with conductive trenches 1690, which may be filled with a conformally deposited metal. The conductive trenches 1690 may form electrical connections to other devices and components to form an integrated circuit, for example an ASIC or a central processing unit (CPU).

Figure 47:
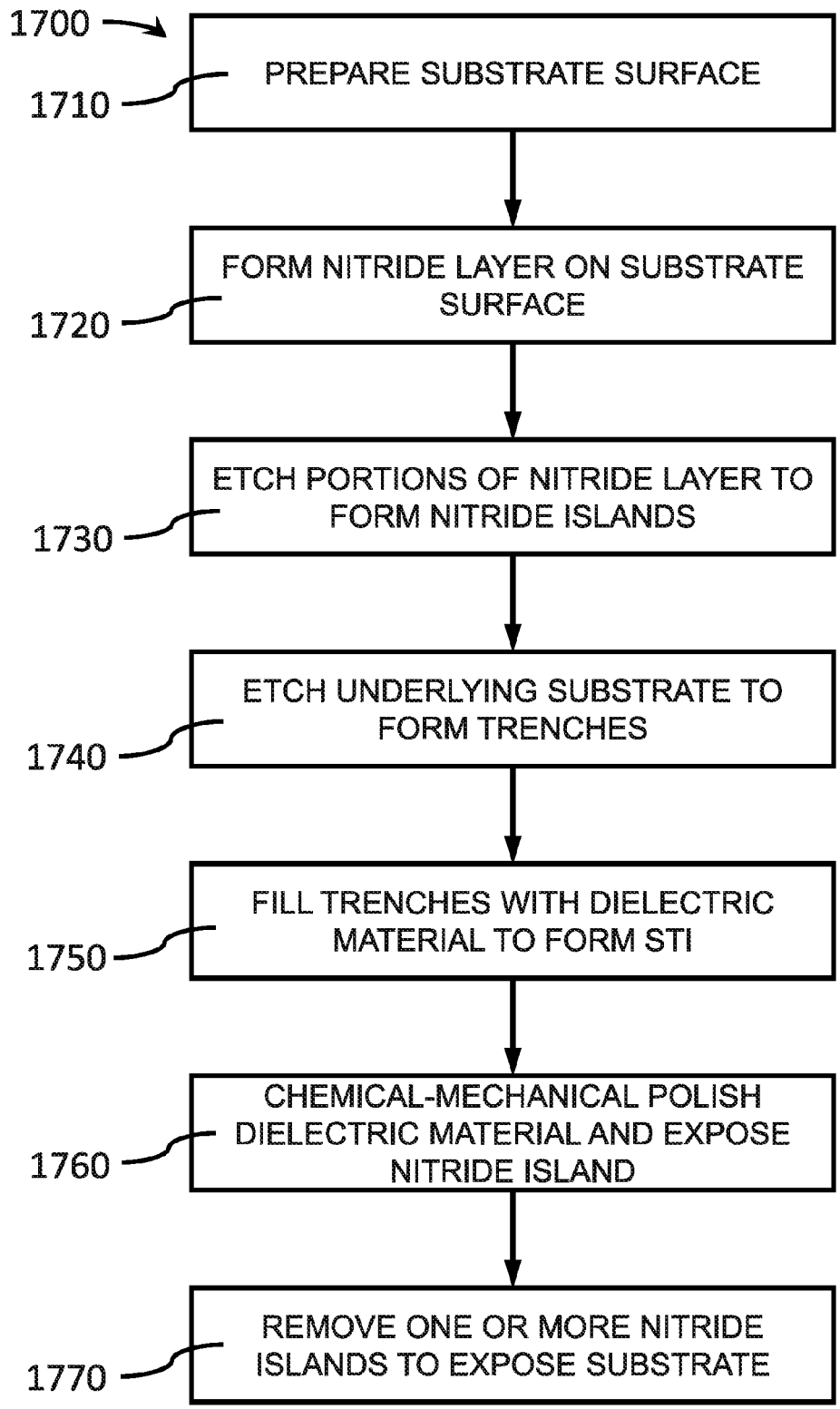
FIG. 47 is a block/flow diagram of an exemplary method of forming a vertical finFET in accordance with an illustrative embodiment.

FIG. 47 is a block/flow diagram of an exemplary method of forming a vertical finFET in accordance with an illustrative embodiment.

In block 1710 of method 1700, a substrate surface is prepared for subsequent deposition and forming steps, where the substrate may be prepared by removing a native oxide layer, cleaning to remove organic and ionic contaminants, and heat treating to provide a crystalline surface suitable for epitaxial growth.

In block 1720, a nitride layer may be formed over at least a portion of the prepared substrate surface, where the nitride layer may be $Si_3N_4$. The nitride layer may function as a mask for subsequent etching and forming processes.

In block 1730, portions of the nitride layer may be removed by masking and etching to reveal portions of the underlying substrate, while leaving nitride islands over other portions of the substrate surface.

In block 1740, the revealed portions of the underlying substrate may be etched to form trenches within the substrate.

In block 1750, a dielectric material may be deposited in the trenches. The dielectric material can form shallow trench isolation regions on the substrate, which separate the raised substrate portions covered by the nitride islands. The deposited dielectric material may fill the trenches and cover the nitride islands. In various embodiments, the dielectric material deposited in the trenches is $SiO_2$, where the $SiO_2$ is not thermally grown.

In block 1760, the dielectric material may be chemically-mechanically polished to remove the portion of dielectric material extending above the surface of the nitride islands. The chemical-mechanical polishing may provide a uniform planar surface that can define an initial height for subsequent etching and deposition processes.

In block 1770, one or more of the nitride islands exposed by the chemical-mechanical polishing may be removed to expose the underlying substrate. The exposed nitride islands may be removed by a selective etching process, for example, a RIE and/or a phosphoric acid solution for $Si_3N_4$.

Figure 48:
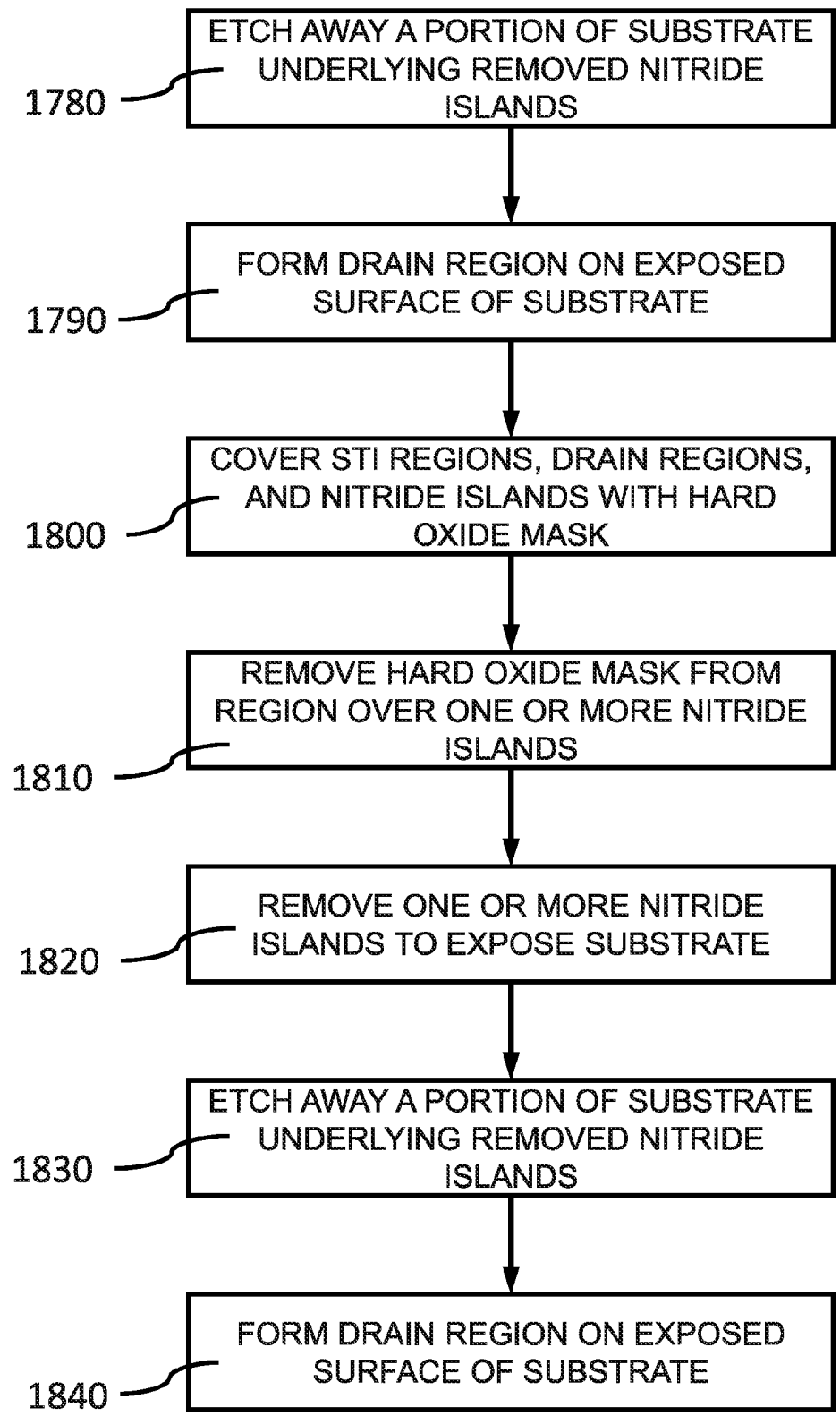
FIG. 48 is a continuation of the block/flow diagram of an exemplary method of forming a vertical finFET of FIG. 47 in accordance with an illustrative embodiment.

FIG. 48 is a continuation of the block/flow diagram of an exemplary method of forming a vertical finFET of FIG. 47 in accordance with an illustrative embodiment.

In block 1780, the height of the underlying substrate may be reduced by etching away a portion of the substrate material underlying the previously removed nitride island(s). A recessed region may be formed by etching a predetermined amount of substrate material, where the recessed region has an exposed bottom surface. The exposed bottom surface of the recessed region may be above the bottom surface of the neighboring STI regions after etching is completed, so the STI regions separate the recessed regions of the substrate.

In block 1790, a first material may be deposited in the recessed region to form a first drain for a finFET structure. The first drain may be epitaxially grown from the exposed bottom surface of the recessed region in the substrate, so the drain has the same crystal structure and orientation as the surface of the substrate. In various embodiments, the composition of the substrate may be predetermined or adjusted to change the lattice parameters of the substrate and bottom surface to control for crystal strain and/or defects and dislocations at the epitaxy interface. The crystal orientation and lattice constants of the substrate may be predetermined to provide epitaxial growth properties and electrical properties (i.e., controlled lattice mismatch, strain, minimal dislocations) at the interfaces of the device components. In various embodiments, the drain may be an n-doped drain or a p-doped drain.

While various embodiments may be described as having the drain initially formed in the recessed regions, this is for descriptive purposes only, and in one or more embodiments the source and drain may be exchanged so the source material is formed in the recess region.

In block 1800, a hard oxide mask may be formed over the STI regions, drains, and nitride islands.

In block 1810, the hard oxide mask may be removed from one or more nitride islands by etching.

In block 1820, the exposed nitride islands may be removed to expose the underlying substrate.

In block 1830, the height of the underlying substrate may be reduced by etching away a portion of the substrate material underlying the previously removed nitride island. A recessed region may be formed by etching a predetermined amount of substrate material, where the recessed region has an exposed bottom surface. The exposed bottom surface of the recessed region may be above the bottom surface of the neighboring STI regions after etching is completed, so the STI regions separate the recessed regions of the substrate.

In block 1840, a second material may be deposited in the recessed region to form a second drain for a finFET structure. The second drain may be epitaxially grown from the exposed bottom surface of the recessed region in the substrate, so the drain has the same crystal structure and orientation as the surface of the substrate. In various embodiments, the composition of the substrate may be predetermined or adjusted to change the lattice parameters of the substrate and bottom surface to control for crystal strain and/or defects and dislocations at the epitaxy interface. In various embodiments, the drain may be an n-doped drain or a p-doped drain. The second material may be the same as or different than the first material.

Figure 49:
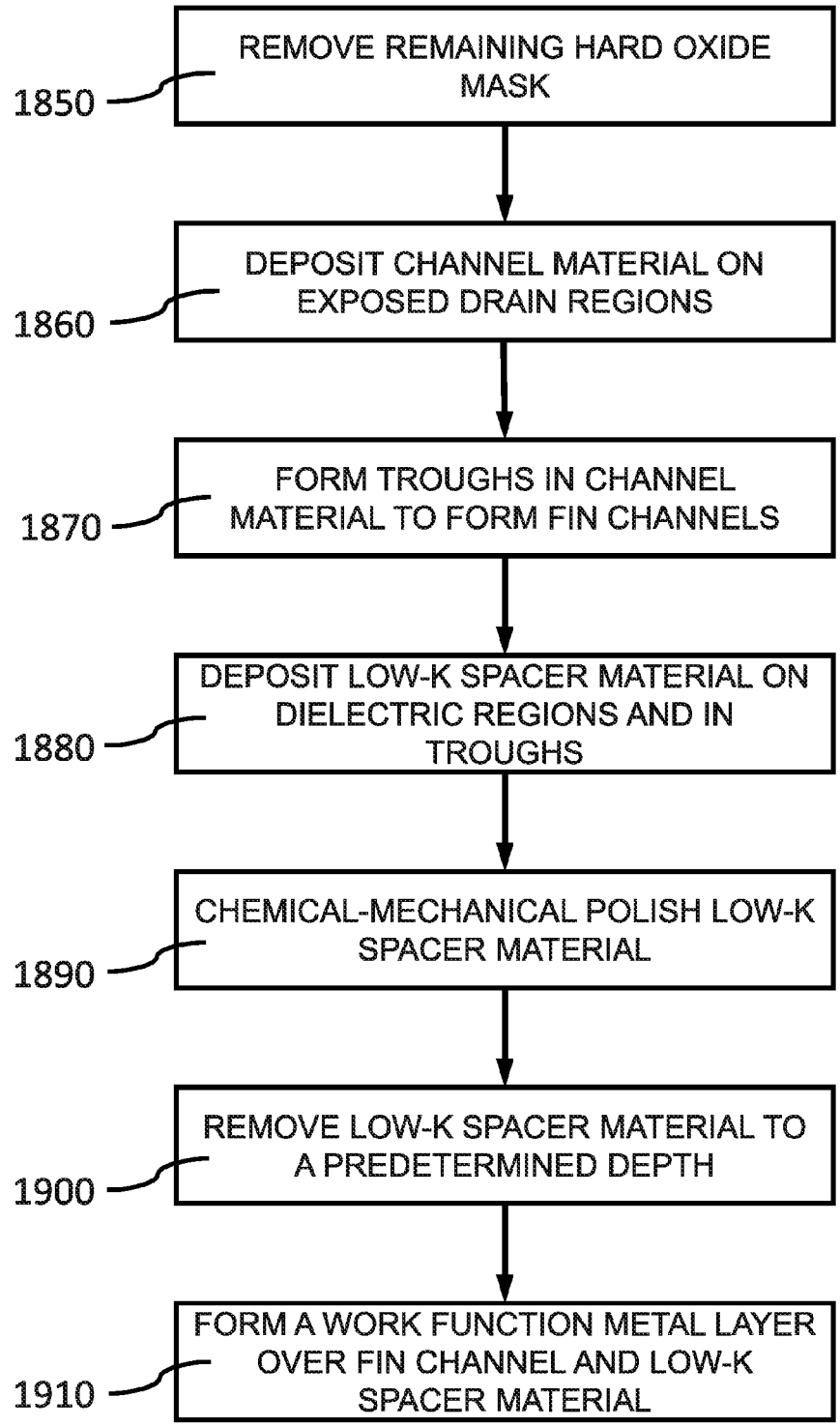
FIG. 49 is a continuation of the block/flow diagram of an exemplary method of forming a vertical finFET of FIG. 48 in accordance with an illustrative embodiment.

FIG. 49 is a continuation of the block/flow diagram of an exemplary method of forming a vertical finFET of FIG. 48 in accordance with an illustrative embodiment.

In block 1850, the hard oxide mask over the previously formed drains and STI regions may be removed to reveal the underlying features. After removal of the hard oxide mask, all of the top surfaces of the drains are exposed for subsequent processes.

In block 1860, a channel material is formed on the exposed drain surfaces. The channel material may be epitaxially grown from the exposed drain surfaces, so the channel material has the same crystal structure and orientation as the surface of the drain. In various embodiments, the channel material is an intrinsic silicon (Si), whereas the drain is an extrinsic material. The channel material may be epitaxially grown to a height greater than the height of the dielectric material of the neighboring STI regions.

In block 1870, portions of the channel material may be removed to form pillars of channel material separated by troughs, where the troughs extend to the surface of the drain from which the channel material was grown. The separation of the pillars of channel material by the troughs forms one or more fin channels extending from the underlying drain. In various embodiments, from 1 to 25 fin channels may be formed on each drain based on a predetermined current carrying capacity of the final finFET.

In block 1880, a low-k spacer material may be formed over the fin channels and in the troughs. The low-k spacer material may be conformally deposited over the fin channels and in the troughs to ensure the troughs are essentially completely filled, although, for example, unintended voids and uncovered surfaces may unintentionally occur. The low-k spacer material may be deposited by ALD, PE-ALD, CVD, PE-CVD, or a combination thereof. In various embodiments, the low-k spacer material may be SiBCN, SiOCN, SiN or combinations thereof.

In block 1890, the deposited low-k spacer material may be chemically-mechanically polished to remove the portion of low-k spacer material extending above the top surface of the fin channels. The chemical-mechanical polishing may provide a uniform planar surface that can define a uniform initial height for subsequent etching and deposition processes.

In block 1900, the height of the low-k spacer material in the troughs and adjacent to the fin channels may be reduced by removing a thickness of the low-k spacer material to a predetermined depth. The predetermined depth may be approximately even with the top surfaces of the $SiO_2$ forming the STI regions, so a uniform surface height is available for subsequent depositions and etchings.

In block 1910, a multi-layer work function metal layer is formed over the top and side surfaces of the fin channels exposed after removal of the low-k spacer material. At least one high-k dielectric material layer may first be formed directly on the top and side surfaces of the fin channels to electrically insulate the fin channels, where the high-k dielectric material may be a high-k oxide material. Additional high-k dielectric material layer(s) having different chemical compositions and properties may be also be deposited, for example a layer of $HfO_2$ and a layer of $HfSiO_4$ may be deposited to control interfacial properties. At least one metal nitride layer is formed over the high-k dielectric material layer to form a contact interface for a gate material and to control the work function of the interface. The WFM layer materials and gate material may be predetermined to achieve intended electrical properties of the finFET device, for example, capacitive coupling and current-voltage characteristics.

Figure 50:
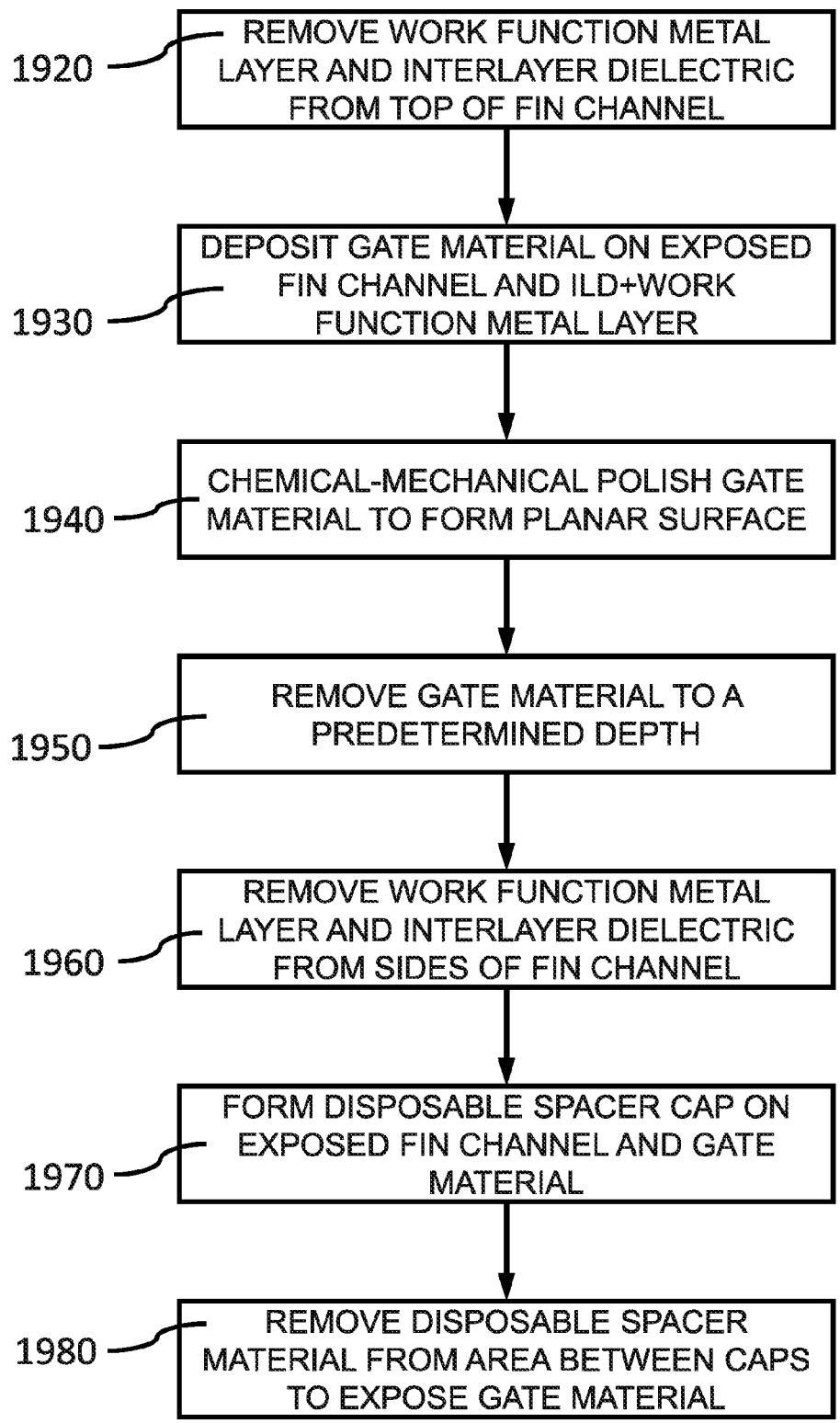
FIG. 50 is a continuation of the block/flow diagram of an exemplary method of forming a vertical finFET of FIG. 49 in accordance with an illustrative embodiment.

FIG. 50 is a continuation of the block/flow diagram of an exemplary method of forming a vertical finFET of FIG. 49 in accordance with an illustrative embodiment.

In block 1920, the portion of the WFM layer on the top surface of the fin channels may be removed to expose the top surfaces of the fin channels.

In block 1930, a gate material may be formed over the fin channels and WFM layer, and fill in the troughs between the WFM layers covering the sides of the fin channels. The gate material may be conformally deposited to ensure the troughs are essentially completely filled and a uniform interface is achieved between the WFM layer and the gate material. In various embodiments, the gate material is tungsten.

In block 1940, the gate material may be chemically-mechanically polished to remove the portion of gate material extending above the top surface of the fin channels. The chemical-mechanical polishing may provide a uniform planar surface that can define a uniform initial height for subsequent etching and deposition processes. The WFM layers and gate material may extend from the low-k spacer material to the top surfaces of the fin channels.

In block 1950, the height of the gate material may be reduced by removing a portion of the gate material to form gate precursors. The height of the fin channel covered by the remaining gate material determines the height of the gate.

In block 1960, the WFM layers on the sides of the fin channels may be removed to expose a portion of the fin channels. The metal nitride layer and high-k dielectric material layer of the WFM layer may be removed by one or more etching processes. The WFM layers and gate precursors may have the same height.

In block 1970 a disposable spacer material is formed over the exposed top and side surfaces of the fin channels, and the exposed surfaces of the WFM layer and gate precursors. The thickness of the disposable spacer material may be precisely controlled, for example, within one atomic layer by an ALD deposition to define a width of a subsequently formed gate, where the disposable spacer material is conformally deposited on the exposed top and side surfaces of the fin channels.

In block 1980, the horizontal portion of the disposable spacer material covering only the gate material of the gate precursors is removed, while the disposable spacer material covering the top and side surfaces of the fin channels remains to create a disposable spacer cap. Masking and/or RIE may be used to selectively etch the disposable spacer material on the top surface of the gate precursors. After etching, the gate material between disposable spacer cap is exposed for subsequent removal.

Figure 51:
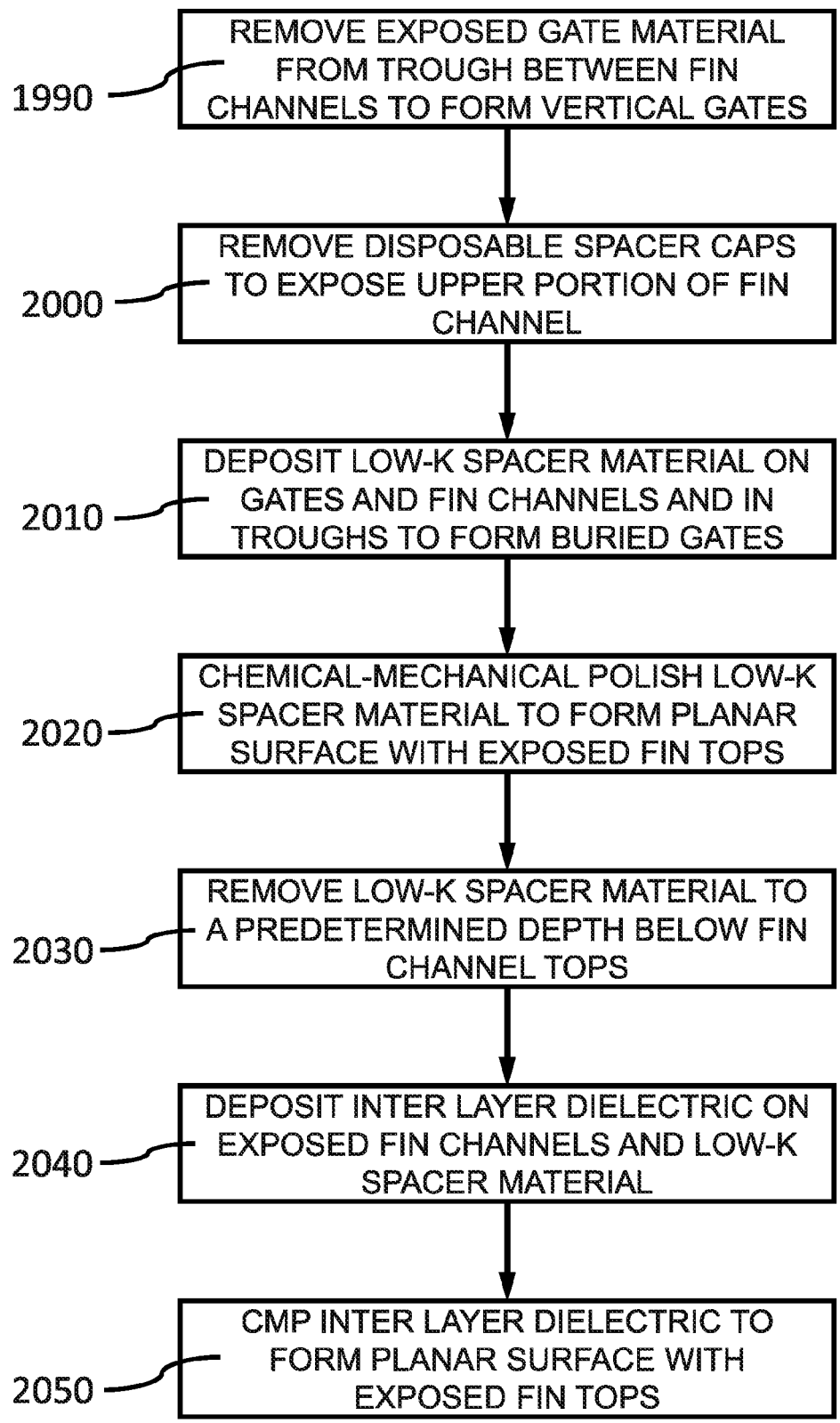
FIG. 51 is a continuation of the block/flow diagram of an exemplary method of forming a vertical finFET of FIG. 50 in accordance with an illustrative embodiment.

FIG. 51 is a continuation of the block/flow diagram of an exemplary method of forming a vertical finFET of FIG. 50 in accordance with an illustrative embodiment.

In block 1990, the exposed gate material of the gate precursors is removed to expose the low-k spacer and create two gates separated by a trough. The low-k spacer electrically insulates the gates from the drain.

In block 2000, the disposable spacer caps are removed from the fin channels. WFM layers and gates of a predetermined height are at least on opposite sides of each fin channel. In various embodiments, the WFM layers and gates are on four sides of the fin channel, where a channel current may be pinched off by a gate voltage, as compared to a MOSFET channel lacking a gate on at least one side.

In block 2010, a low-k spacer material may be formed over the fin channels, WFM layer, and gates, and fill in the troughs between the gates. The low-k spacer material may be conformally deposited to ensure the troughs between the gates are essentially completely filled. In various embodiments, the low-k spacer material may be SiBCN, SiOCN, SiN or combinations thereof.

In block 2020, the low-k spacer material may be chemically-mechanically polished to remove the portion of low-k spacer material extending above the top surface of the fin channels. The chemical-mechanical polishing may provide a uniform planar surface that can define a uniform initial height for subsequent etching and deposition processes.

In block 2030, the low-k spacer material may be removed to a predetermined depth below the tops of the of the fin channels. The low-k spacer material may be etched.

In block 2040, an interlayer dielectric is deposited on the exposed fin channels and exposed surface of the low-k spacer material, where the ILD can be $SiO_2$.

In block 2050, the ILD is chemically-mechanically polished to form a uniform planar surface.

Figure 52:
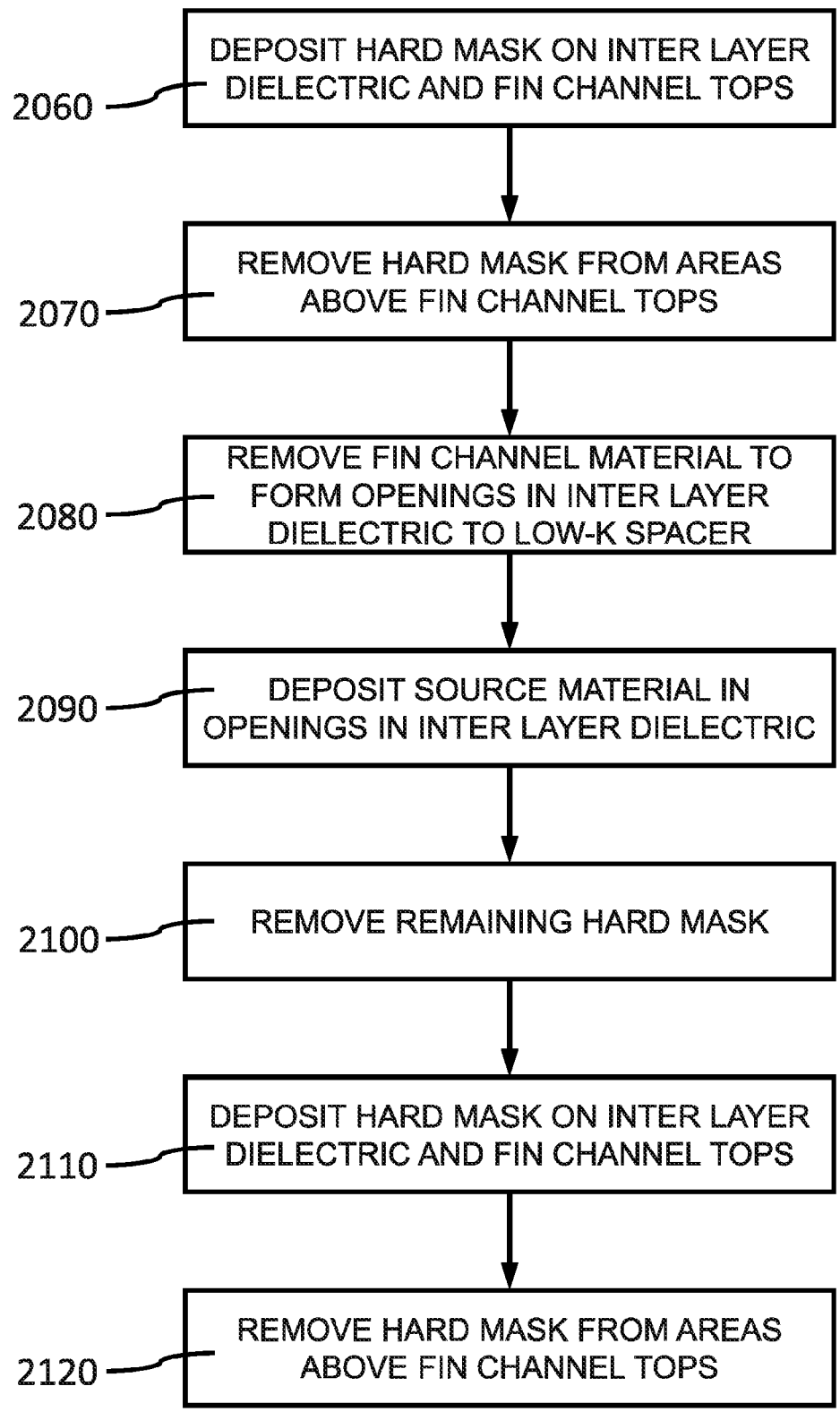
FIG. 52 is a continuation of the block/flow diagram of an exemplary method of forming a vertical finFET of FIG. 51 in accordance with an illustrative embodiment.

FIG. 52 is a continuation of the block/flow diagram of an exemplary method of forming a vertical finFET of FIG. 51 in accordance with an illustrative embodiment.

In block 2060, a first hardmask is deposited on the ILD and the top surfaces of the fin channels.

In block 2070, a portion of the first hardmask is removed from selected areas of the ILD to expose one or more top surfaces of fin channels.

In block 2080, fin channel material is removed to form openings in the ILD. The height of the fin channels may be reduced to the level of the top surface of the low-k spacer.

In block 2090, a material for forming the source of the finFET may be deposited in the openings in the ILD. The source material may be epitaxially grown from the fin channel, and have the same crystal structure and orientation as the fin channel material.

In block 2100, the first hardmask remaining on the surface of the ILD is removed.

In block 2110, a second hardmask is deposited on the surface of the ILD, the previously deposited sources, and the exposed tops of the fin channels.

In block 2120, the second hardmask is removed from selected areas of the ILD to expose one or more top surfaces of fin channels.

Figure 53:
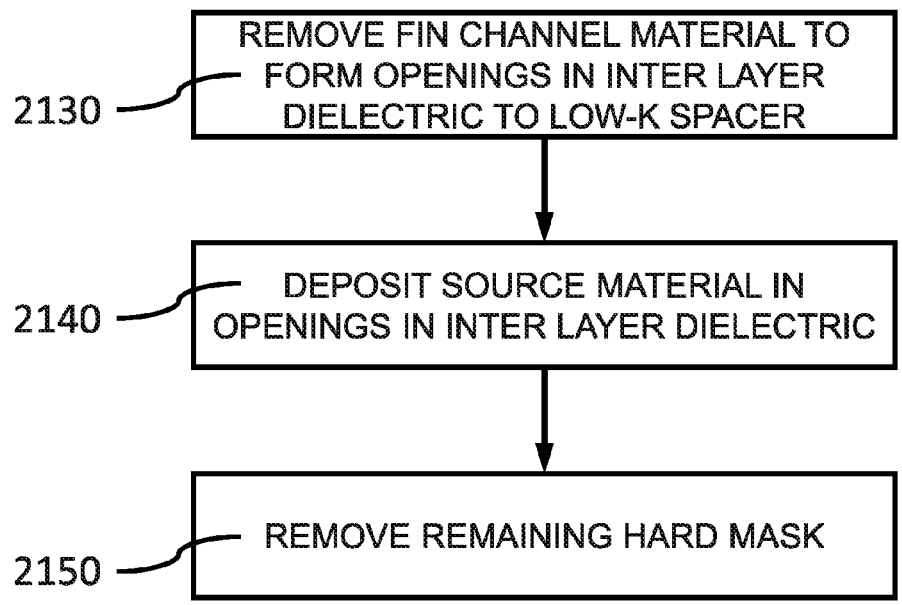
FIG. 53 is a continuation of the block/flow diagram of an exemplary method of forming a vertical finFET of FIG. 52 in accordance with an illustrative embodiment.

FIG. 53 is a continuation of the block/flow diagram of an exemplary method of forming a vertical finFET of FIG. 52 in accordance with an illustrative embodiment.

In block 2130, fin channel material is removed to form openings in the ILD. The height of the fin channels may be reduced to the level of the top surface of the low-k spacer.

In block 2140, a material for forming the source of the finFET may be deposited in the openings in the ILD. The source material may be epitaxially grown from the fin channel, and have the same crystal structure and orientation as the fin channel material. The sources on each of the fin channels associated with the first drain and the second drain have the same crystal orientation as the fin channels.

In block 2150, the second hardmask remaining on the surface of the ILD is removed.

In various embodiments, openings can be made in intervening layers to form vias that may be filled with a conductive material to form electrical contacts with the source, drain and gate. The vias may be filled by depositing one or more conformal layers and electrodepositing a metal in the vias on the conformal layer.

An aspect of the disclosure relates to a method of fabricating a vertical field effect transistor, the method comprising forming a first recess in a substrate with a predetermined crystal orientation, wherein the first recess has a first bottom surface; growing a first drain epiaxially from the bottom surface of the first recess; forming a second recess in the substrate, wherein the second recess has a second bottom surface; growing a second drain epiaxially from the bottom surface of the second recess; growing a channel material epitaxially on the first drain and the second drain; forming troughs in the channel material to form one or more fin channels on the first drain and one or more fin channels on the second drain, wherein the troughs over the first drain extend to the surface of the first drain, and the troughs over the second drain extend to the surface of the second drain; forming a WFM cap on each of the fin channels; forming a gate on each of the WFM caps, wherein the WFM cap electrically separates the gate from the fin channel; growing a first source epitaxially on each of the fin channels grown on the first drain; and growing a second source epitaxially on each of the fin channels grown on the second drain.

An aspect of the disclosure also relates to a vertical field effect transistor comprising a first recess in a substrate with a predetermined crystal orientation, wherein the first recess has a first bottom surface; a first drain on the bottom surface of the first recess, wherein the first drain has the same crystal orientation as the first bottom surface; a second recess in the substrate, wherein the second recess has a second bottom surface; a second drain on the bottom surface of the second recess, wherein the second drain has the same crystal orientation as the second bottom surface; one or more fin channels on the first drain, wherein the one or more fin channels on the first drain have the same crystal orientation as the first bottom surface; one or more fin channels on the second drain, wherein the one or more fin channels on the second drain have the same crystal orientation as the second bottom surface; a WFM cap on each of the fin channels; a gate on each of the WFM caps, wherein the WFM cap electrically separates the gate from the fin channel; a first source on each of the fin channels grown on the first drain, wherein the first source has the same crystal orientation as the first bottom surface; and a second source on each of the fin channels grown on the second drain, wherein the second source has the same crystal orientation as the second bottom surface.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating a vertical field effect transistor comprising:
   forming a first recess in a substrate, wherein the first recess has a first bottom surface;
   epitaxially growing a first drain from the first bottom surface of the first recess;
   epitaxially growing a second drain from the second bottom surface of a second recess formed in the substrate;
   epitaxially growing a channel material on the first drain and the second drain;
   forming troughs in the channel material to form one or more fin channels on the first drain and one or more fin channels on the second drain, wherein the troughs over the first drain extend to the surface of the first drain, and the troughs over the second drain extend to the surface of the second drain;
   forming a gate structure on each of the one or more fin channels; and
   growing sources on each of the fin channels associated with the first and second drains.

2. The method of claim 1 further comprising forming a shallow trench isolation region in the substrate, wherein the shallow trench isolation region is between the first drain and the second drain, and forming a first low-k dielectric spacer in each of the troughs between the fin channels.

3. The method of claim 1 further comprising forming a first drain contact to the first drain, forming a first gate contact to the first gate, and forming a first source contact to each of the source(s) on the fin channels associated with the first drain.

4. The method of claim 1, wherein from 1 to 25 fin channels are formed on the first drain, and from 1 to 25 fin channels are formed on the second drain.

5. The method of claim 1, wherein the fin channels have a height in the range of about 30 nm to about 400 nm, and the fin channels comprise intrinsic silicon.

6. The method of claim 1, wherein the first drain and the sources on the fin channels associated with the first drain comprise an n-doped material, and the second drain and sources on the fin channels associated with the second drain comprise a p-doped material.

7. The method of claim 1, wherein the gate structure comprises work function metal (WFM) caps formed on the fin channels by atomic layer deposition (ALD) or plasma-enhanced atomic layer deposition (PE-ALD).

8. The method of claim 7, wherein each of the WFM caps is formed to a thickness in the range of about 5 nm to about 15 nm, and the gate on each of the WFM caps is formed to a thickness in the range of about 2 nm to about 5 nm.

9. A method of fabricating a vertical field effect transistor comprising:
   forming a shallow trench isolation region in a substrate;
   forming a first recess in a substrate, wherein the first recess has a first bottom surface;
   epitaxially growing a first drain from the first bottom surface of the first recess;
   epitaxially growing a second drain from the second bottom surface of a second recess formed in the substrate, wherein the shallow trench isolation region is between the first drain and the second drain;
   growing a channel material epitaxially on the first drain and the second drain, wherein the channel material comprises intrinsic silicon;
   forming troughs in the channel material to form one or more fin channels on the first drain and one or more fin channels on the second drain, wherein the troughs over the first drain extend to the surface of the first drain, and the troughs over the second drain extend to the surface of the second drain;
   forming a first low-k dielectric spacer in each of the troughs between the fin channels;
   forming a gate structure on each of the one or more fin channels; and growing sources on each of the fin channels associated with the first and second drains.

10. The method of claim 9, wherein the fin channels have a height in the range of about 30 nm to about 400 nm, and the fin channels comprise intrinsic silicon.

11. The method of claim 9, wherein the gate structure has a height in the range of about 20 nm to about 300 nm.

12. The method of claim 9, wherein each gate structure on each of the one or more fin channels comprises a WFM cap formed to a thickness in the range of about 5 nm to about 15 nm, and a gate on each of the WFM caps formed to a thickness in the range of about 2 nm to about 5 nm.

13. The method of claim 12, wherein the gate comprises tungsten.

* * * * *